(12) United States Patent
Kishimoto et al.

(10) Patent No.: US 11,640,038 B2
(45) Date of Patent: May 2, 2023

(54) LENS, LIGHT EMITTING DEVICE AND METHOD OF MANUFACTURING THE LENS AND THE LIGHT EMITTING DEVICE

(71) Applicant: NICHIA CORPORATION, Anan (JP)

(72) Inventors: Tomohisa Kishimoto, Anan (JP); Tsuyoshi Okahisa, Tokushima (JP); Toshiyuki Fujii, Anan (JP)

(73) Assignee: NICHIA CORPORATION, Anan (JP)

( * ) Notice: Subject to any disclaimer, the term of this patent is extended or adjusted under 35 U.S.C. 154(b) by 564 days.

(21) Appl. No.: 16/558,275

(22) Filed: Sep. 2, 2019

(65) Prior Publication Data

US 2020/0073074 A1 Mar. 5, 2020

(30) Foreign Application Priority Data

Aug. 31, 2018 (JP) .............................. JP2018-162680

(51) Int. Cl.
*G02B 7/02* (2021.01)
*B29D 11/00* (2006.01)
(Continued)

(52) U.S. Cl.
CPC .......... *G02B 7/02* (2013.01); *B29D 11/00269* (2013.01); *G02B 7/003* (2013.01); *H01L 33/10* (2013.01); *H01L 2933/0025* (2013.01)

(58) Field of Classification Search
CPC ............ G02B 7/02; G02B 7/003; G02B 3/08; G02B 19/0014; G02B 19/0047;
(Continued)

(56) References Cited

U.S. PATENT DOCUMENTS 3,612,853 A 10/1971 Aoki
5,101,327 A 3/1992 Jewett et al.
(Continued)

FOREIGN PATENT DOCUMENTS

CN 1929159 3/2007
CN 101526654 9/2009
(Continued)

OTHER PUBLICATIONS

Office Action with Form PTO-892 Notice of References Cited issued by the U.S. Patent and Trademark Office for the co-pending U.S. Appl. No. 17/106,182, dated Feb. 3, 2023.

*Primary Examiner* — Darryl J Collins
*Assistant Examiner* — Matthew Y Lee
(74) *Attorney, Agent, or Firm* — Mori & Ward, LLP

(57) ABSTRACT

A lens includes a cover part and a light-shielding part. The cover part includes a lens part, a connection part extending downward from lateral sides of the lens part, and one or more flange parts each extending outward from a lower-end portion of the connection part. The lens part and the connection part define a recess having an opening facing downward. The flange parts extend outward from a periphery of the opening of the recess. The lens part, the flange parts, and the connection part are formed of a thermosetting first resin and continuous to one another. The light-shielding part covers outer lateral surface of the connection part and is formed of a thermosetting second resin having a greater light-absorptance or a greater light-reflectance than the thermosetting first resin. The flange parts have a greater thickness than the connection part.

21 Claims, 16 Drawing Sheets

(51) Int. Cl.
*G02B 7/00* (2021.01)
*H01L 33/10* (2010.01)

(58) Field of Classification Search
CPC .............. G02B 7/025; B29D 11/00269; B29D 11/00442; B29D 11/00307; H01L 33/10; H01L 2933/0025; H01L 33/58; H01L 2933/0058; H01L 33/483; H01L 33/46; H01L 33/44; B29C 45/37; B29C 45/16; B29C 2793/009; B29C 45/0055
See application file for complete search history.

(56) References Cited

U.S. PATENT DOCUMENTS

| | | | |
|---|---|---|---|
| 5,130,531 A | 7/1992 | Ito et al. | |
| 5,477,441 A | 12/1995 | Budnovitch et al. | |
| 6,052,232 A | 4/2000 | Iwaki | |
| 6,614,602 B1 * | 9/2003 | Huang | B29D 11/00 359/811 |
| 9,863,605 B2 | 1/2018 | Haitz et al. | |
| 2004/0190286 A1 | 9/2004 | Chapman | |
| 2005/0083686 A1 | 4/2005 | Yatsuda et al. | |
| 2005/0099805 A1 | 5/2005 | Chapman | |
| 2005/0265019 A1 | 12/2005 | Sommers et al. | |
| 2006/0044806 A1 | 3/2006 | Abramov et al. | |
| 2006/0226774 A1 | 10/2006 | Sofue et al. | |
| 2006/0239000 A1 | 10/2006 | McDermott, Sr. et al. | |
| 2007/0195418 A1 | 8/2007 | Kogure et al. | |
| 2007/0205425 A1 | 9/2007 | Harada | |
| 2009/0008662 A1 | 1/2009 | Ashdown et al. | |
| 2009/0122242 A1 | 5/2009 | Nakamura | |
| 2009/0225157 A1 | 9/2009 | Orihara et al. | |
| 2009/0298376 A1 | 12/2009 | Guillien et al. | |
| 2010/0061106 A1 | 3/2010 | Shyu et al. | |
| 2011/0141742 A1 | 6/2011 | Tanaka et al. | |
| 2011/0188252 A1 | 8/2011 | Lin | |
| 2011/0228398 A1 | 9/2011 | Sakaki et al. | |
| 2011/0261569 A1 | 10/2011 | Kayanuma | |
| 2011/0272833 A1 | 11/2011 | Tsai et al. | |
| 2012/0099326 A1 * | 4/2012 | Hammond | F21S 43/14 438/27 |
| 2012/0104435 A1 | 5/2012 | Lee et al. | |
| 2012/0162997 A1 | 6/2012 | Birkholz et al. | |
| 2012/0199727 A1 | 8/2012 | Kubota | |
| 2013/0027922 A1 * | 1/2013 | Chen | F21V 14/025 362/187 |
| 2013/0120707 A1 | 5/2013 | Shan et al. | |
| 2013/0153934 A1 | 6/2013 | Meitl et al. | |
| 2013/0335955 A1 | 12/2013 | Lee | |
| 2015/0075025 A1 | 3/2015 | Pell et al. | |
| 2015/0137163 A1 | 5/2015 | Harris | |
| 2016/0077244 A1 | 3/2016 | Saito | |
| 2016/0254500 A1 | 9/2016 | Kawata et al. | |
| 2016/0320472 A1 | 11/2016 | Okushiba | |
| 2016/0377258 A1 | 12/2016 | Xu et al. | |
| 2017/0227190 A1 | 8/2017 | Fujikawa et al. | |
| 2017/0294560 A1 | 10/2017 | Ho et al. | |
| 2017/0317251 A1 | 11/2017 | Sweegers et al. | |
| 2017/0370539 A1 | 12/2017 | Xu et al. | |
| 2018/0231777 A1 | 8/2018 | Yoon et al. | |
| 2018/0231778 A1 | 8/2018 | Yoon et al. | |
| 2018/0306405 A1 | 10/2018 | Kong | |
| 2019/0264890 A1 * | 8/2019 | Chang | G02B 3/08 |
| 2019/0267518 A1 * | 8/2019 | Hino | H01L 33/54 |
| 2019/0302323 A1 | 10/2019 | Tsai et al. | |
| 2020/0073074 A1 | 3/2020 | Kishimoto et al. | |
| 2022/0146074 A1 | 5/2022 | Kiba et al. | |
| 2022/0282851 A1 | 9/2022 | De Bevilacqua et al. | |

FOREIGN PATENT DOCUMENTS

| | | |
|---|---|---|
| CN | 102576093 | 7/2012 |
| CN | 102856478 | 1/2013 |
| CN | 204678257 U | 9/2015 |
| CN | 205137343 U | 4/2016 |
| CN | 107167985 | 9/2017 |
| CN | 207133557 U | 3/2018 |
| CN | 207702153 U | 8/2018 |
| JP | 06-079013 U | 11/1994 |
| JP | 2002-289926 | 10/2002 |
| JP | 2010-040801 | 2/2010 |
| JP | 2010-040802 | 2/2010 |
| JP | 5139915 B2 | 2/2010 |
| JP | 2010-103404 | 5/2010 |
| JP | 2011-062879 | 3/2011 |
| JP | 2011-197479 | 10/2011 |
| JP | 2012-119185 | 6/2012 |
| JP | 2012-185239 | 9/2012 |
| JP | 2012-185240 | 9/2012 |
| JP | 2014-006488 | 1/2014 |
| JP | 2015-090776 | 5/2015 |
| JP | 2015-090781 | 5/2015 |
| JP | 2016-164874 | 9/2016 |
| JP | 2016-194568 | 11/2016 |
| JP | 2017-533590 | 11/2017 |
| WO | WO 2013/164054 | 11/2013 |
| WO | WO 2015/025970 | 2/2015 |
| WO | WO 2015/146539 | 10/2015 |

* cited by examiner

LENS, LIGHT EMITTING DEVICE AND METHOD OF MANUFACTURING THE LENS AND THE LIGHT EMITTING DEVICE

CROSS-REFERENCE TO RELATED PATENT APPLICATION

The present application claims priority under 35 U. S. C. § 119 to Japanese Patent Application No. 2018-162680, filed Aug. 31, 2018. The contents of Japanese Patent Application No 2018-162680 are incorporated herein by reference in its entirety.

BACKGROUND OF THE INVENTION

Field of the Invention

The present disclosure relates to a lens and a light emitting device, and a method of manufacturing the lens and the light emitting device.

Discussion of the Background

Applications for flush light sources used in cellular phones and other mobile devices, a light emitting device may include an LED element mounted on a circuit board, a cover having an optical lens disposed facing the LED element, and a light-reflecting member integrally formed with the cover, for example, described in Japanese patent publication No. 5139915. In the light emitting device described in Japanese patent publication No. 5139915, a metal film is used as the light-reflecting member and the metal film is formed by way of, for example, vacuum vapor deposition.

SUMMARY OF THE INVENTION

A lens according to one embodiment of the present disclosure includes a cover part and a light-shielding part. The cover part includes: a lens part having one or more lateral sides; a connection part constituting one or more lateral side walls each extending downward from a respective one of the one or more lateral sides of the lens part; and one or more flange parts each extending outward from a lower-end portion of a corresponding one of the one or more lateral side walls. The lens part and the connection part define a recess having an opening facing downward. The lens part defines a bottom surface of the recess. The one or more lateral side walls define lateral surfaces of the recess, which define the opening of the recess. The one or more flange parts extend outward from a periphery of the opening of the recess. The lens part, the one or more flange parts, and the connection part are formed of a thermosetting first resin and continuous to one another. The light-shielding part covers outer lateral surfaces of the one or more lateral side walls and are formed of a thermosetting second resin having a greater light-absorptance or a greater light-reflectance than the thermosetting first resin. The flange part has a greater thickness than the connection part.

A lens according to one embodiment of the present disclosure includes a cover part and a light-shielding part. The cover part includes: a lens part having one or more lateral sides; a connection part constituting one or more lateral side walls each extending downward from a respective one of the one or more lateral sides of the lens part; and one or more flange parts each extending outward from a lower-end portion of a corresponding one of the one or more lateral side walls. The lens part, the one or more flange parts, and the connection part are formed of a thermosetting first resin and are continuous to one another. The one or more flange parts each have a thickness greater than 30 μm. The light-shielding part covers outer lateral surfaces of the one or more lateral side walls and is formed of a thermosetting second resin having a greater light-absorptance or a greater light-reflectance than the thermosetting first resin.

A light emitting device according to one embodiment of the present disclosure includes a light emitting element and a lens. The lens includes a cover part and a light-shielding part. The cover part includes: a lens part having one or more lateral sides; a connection part constituting one or more lateral side walls each extending downward from a respective one of the one or more lateral sides of the lens part; and one or more flange parts each extending outward from a lower-end portion of a corresponding one of the one or more lateral side walls. The lens part and the connection part define a recess having an opening facing downward. The lens part defines a bottom surface of the recess. The one or more lateral side walls define lateral surfaces of the recess, which define the opening of the recess. The one or more flange parts extend outward from a periphery of the opening of the recess. The lens part, the one or more flange parts, and the connection part are formed of a thermosetting first resin and are continuous to one another. The light-shielding part covers outer lateral surfaces of the one or more lateral side walls and is formed of a thermosetting second resin having a greater light-absorptance or a greater light-reflectance than the thermosetting first resin. The one or more flange parts have a greater thickness than the connection part. The lens part is disposed at a location allowing light from the light emitting element to be transmitted through the lens part.

A light emitting device according to one embodiment of the present disclosure includes a light emitting element and a lens. The lens includes a cover part and a light-shielding part. The cover part includes: a lens part having one or more lateral sides; a connection part constituting one or more lateral side walls each extending from a respective one of the one or more lateral sides of the lens part; and one or more flange parts each extending outward from a lower-end portion of a corresponding one of the one or more lateral side walls. The lens part, the one or more flange parts, and the connection part are formed of a thermosetting first resin and are continuous to one another, with a thickness of each of the one or more flange parts being greater than 30 μm. The light-shielding part covers outer lateral surfaces of the one or more lateral side walls and is formed of a thermosetting second resin having a greater light-absorptance or a greater light-reflectance than the thermosetting first resin. The lens part is disposed at a location allowing light from the light emitting element to be transmitted through the lens part.

A method of manufacturing a lens according to one embodiment of the present disclosure includes: forming a cover blank, the forming a cover blank including, injecting a thermosetting first resin in a first mold and curing the first resin, to form a cover blank having a plurality of cover parts, each of the cover parts including a lens part having one or more lateral sides, a connection part constituting one or more lateral side walls each extending downward from a respective one of the one or more lateral sides of the lens part, and one or more flange parts each extending outward form a lower-end portion of a corresponding one of the one or more lateral side walls, the lens part, the flange part, and the connection part being continuous to one another, the lens part and the connection part defining a recess having an opening facing downward, the one or more flange parts extending outward from a periphery of the opening of the recess; removing a part or all parts of the first mold; arranging the cover blank in a second mold; forming a lens blank, the forming a lens blank including, injecting a thermosetting second resin having a greater light absorptance or a greater light reflectance than the thermosetting first resin into the second mold, and curing the thermosetting second resin, to form a lens blank having a light-shielding part between adjacent ones of the cover parts; and obtaining individual lenses, the obtaining individual lenses including, taking out the lens blank from the second mold, and cutting the lens blank at the light-shielding part located between adjacent ones of the cover parts to obtain individual lenses each with outer surfaces of the one or more lateral side walls (and an upper surface of each of the one or more flange parts) covered by the light-shielding part.

A method of manufacturing a lens according to one embodiment of the present disclosure includes: forming a cover blank, removing a part or an entire of the first mold, arranging the cover blank in a second mold, forming a lens blank, and obtaining individual lenses. The forming a cover blank includes injecting a thermosetting first resin in a first mold and curing the first resin to form a cover blank having a plurality of cover parts, each of the cover parts including a lens part having one or more lateral sides, a connection part constituting one or more lateral side walls each extending downward from a respective one of the one or more lateral sides of the lens part, and one or more flange parts each extending outward form a lower-end portion of a corresponding one of the one or more lateral side walls. The lens part, the flange part, and the connection part being continuous to one another. The one or more flange parts have a thickness greater than a thickness of the connection part. The lens part and the connection part define a recess having an opening facing downward. The lens part defines a bottom surface of the recess. The one or more lateral side walls constituted by the connection part define lateral surface(s) of the recess, which define the opening of the recess. The recess is located inward of the one or more flange parts. The removing a part or an entire of the first mold is performed after the cover blank is formed. In the arranging the cover mold in a second mold, the cover blank is arranged in a second mold. The forming a lens blank includes injecting a thermosetting second resin in the second mold, the second resin having a greater light absorptance or a greater light reflectance than the thermosetting first resin, and curing the second resin to form a light-shielding part between adjacent ones of the cover parts. The obtaining individual lenses includes taking out the lens blank from the second mold and cutting the lens blank at the light-shielding part located between the adjacent ones of the cover parts to obtain individual lenses each having the outer lateral sides of the connection part (and an upper surface of each of the one or more flange parts) covered by the light-shielding part.

A method of manufacturing a lens according to one embodiment of the present disclosure includes: forming a cover blank, the forming a cover blank including, injecting a thermosetting first resin in a first mold, and curing the first resin, to form a cover blank having a plurality of cover parts, each of the cover parts including a lens part having one or more lateral sides, a connection part constituting one or more lateral side walls each extending downward from a respective one of the one or more lateral sides of the lens part, and one or more flange parts each extending outward from a lower-end portion of a corresponding one of the one or more lateral side walls, the lens part, the one or more flange parts, and the connection part being continuous to one another, the one or more flange parts having a thickness greater than 30 μm; removing a part or all parts of the first mold; arranging the cover blank in a second mold; forming a lens blank, the forming a lens blank including, injecting a thermosetting second resin having a greater light absorptance or a greater light reflectance than the thermosetting first resin into the second mold and curing the thermosetting second resin, to form a lens blank having a light-shielding part between adjacent ones of the cover parts; and obtaining individual lenses, the obtaining individual lenses including, taking out the lens blank from the second mold, and cutting the lens blank at the light-shielding part located between the adjacent ones of the cover parts to obtain individual lenses each with outer surfaces of the one or more lateral side walls (and an upper surface of each of the one or more flange parts) covered by the light-shielding part.

A method of manufacturing a lens according to one embodiment of the present disclosure includes forming a cover blank, the forming a cover blank including, injecting a thermosetting first resin in a first mold, and curing the thermosetting first resin, to form a cover blank having a plurality of cover parts, each of the cover parts including a lens part having one or more lateral sides, a connection part constituting one or more lateral side walls each extending downward from a respective one of the one or more lateral sides of the lens part, and one or more flange parts each extending from a lower-end portion of a corresponding one of the one or more lateral side walls, each of the one or more flange parts having a greater thickness than the connection part, and the lens part, the one or more flange parts, and the connection part being continuous to one another; removing the first mold; cutting the cover blank at the flange part located between adjacent ones of the cover parts; arranging the cut cover blank in a second mold; forming a lens blank, the forming the lens blank including, injecting a thermosetting second resin having a greater light absorptance or a greater light reflectance than the thermosetting first resin into the second mold and curing the thermosetting second resin to form a lens blank having a light-shielding part located between adjacent ones of the cover parts; and obtaining individual lenses, the obtaining individual lenses including, taking out the lens blank from the second mold, cutting the lens blank at the light-shielding part located between the adjacent ones of the cover parts to obtain individual lenses each with outer surfaces of the one or more side walls and an outer end surface, in addition to an upper surface, of each of the one or more flange parts covered by the light-shielding part.

A method of manufacturing a light emitting device according to one embodiment of the present disclosure includes providing a lens according one of the methods described above, and arranging the lens such that light from the light emitting element is transmitted through the lens part of the lens.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

In the following, certain embodiments will be described with reference to the drawings. However, the embodiments shown below are exemplify lenses, light emitting devices for embodying the technical idea of the present invention, and the technical idea of the present invention is not limited thereto. The sizes, materials, shapes and the relative positions of the members described in the embodiments are given as examples and not as a limitation to the scope of the invention unless specifically stated. The sizes and positional relationships of the members in each of drawings are occasionally shown exaggerated for ease of explanation.

First Embodiment

Figure 1:
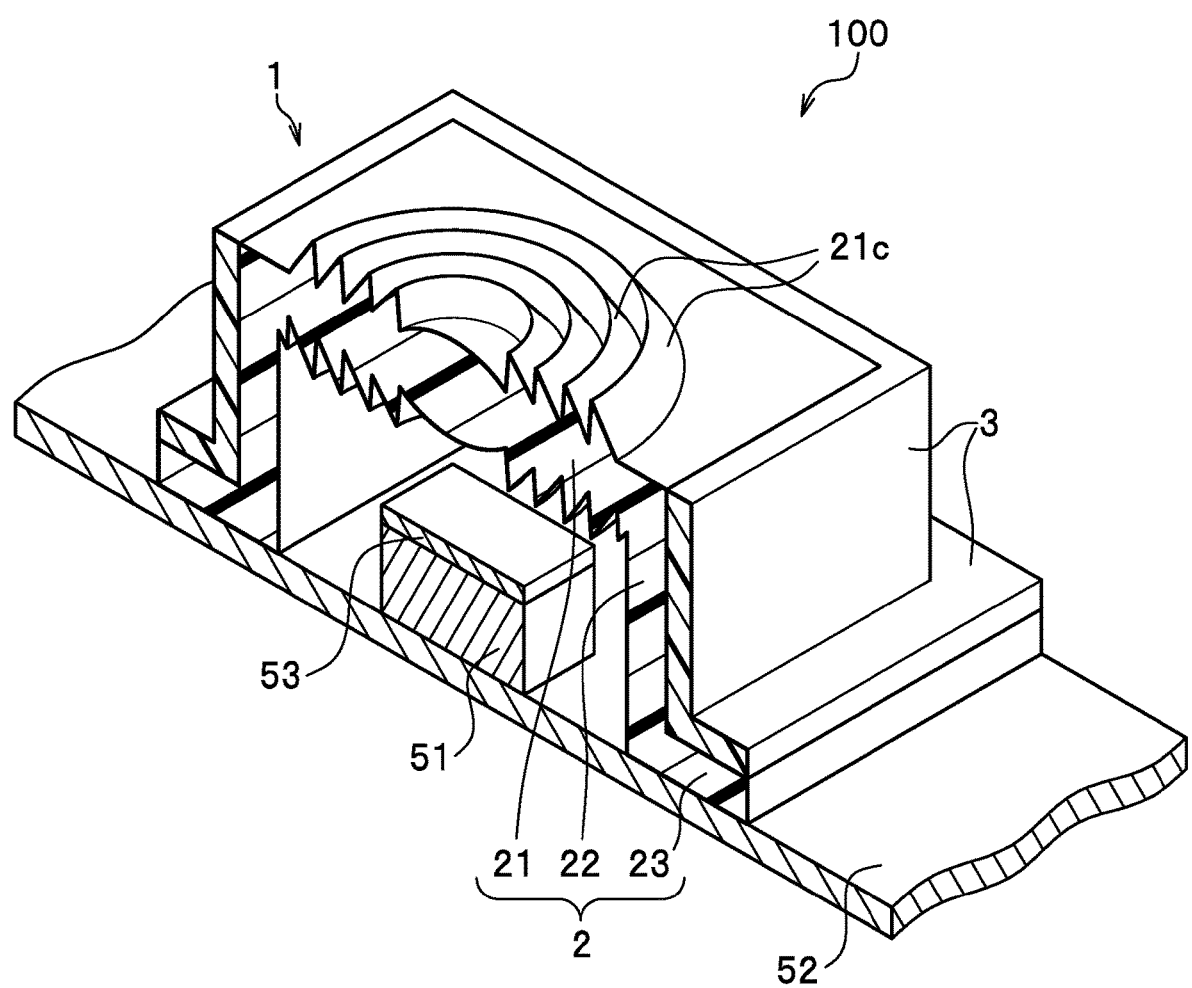
FIG. 1 is a perspective sectional view schematically showing a structure of a light emitting device that includes a lens according to a first embodiment, taken along a line passing through the center of the light emitting device.
Figure 2:
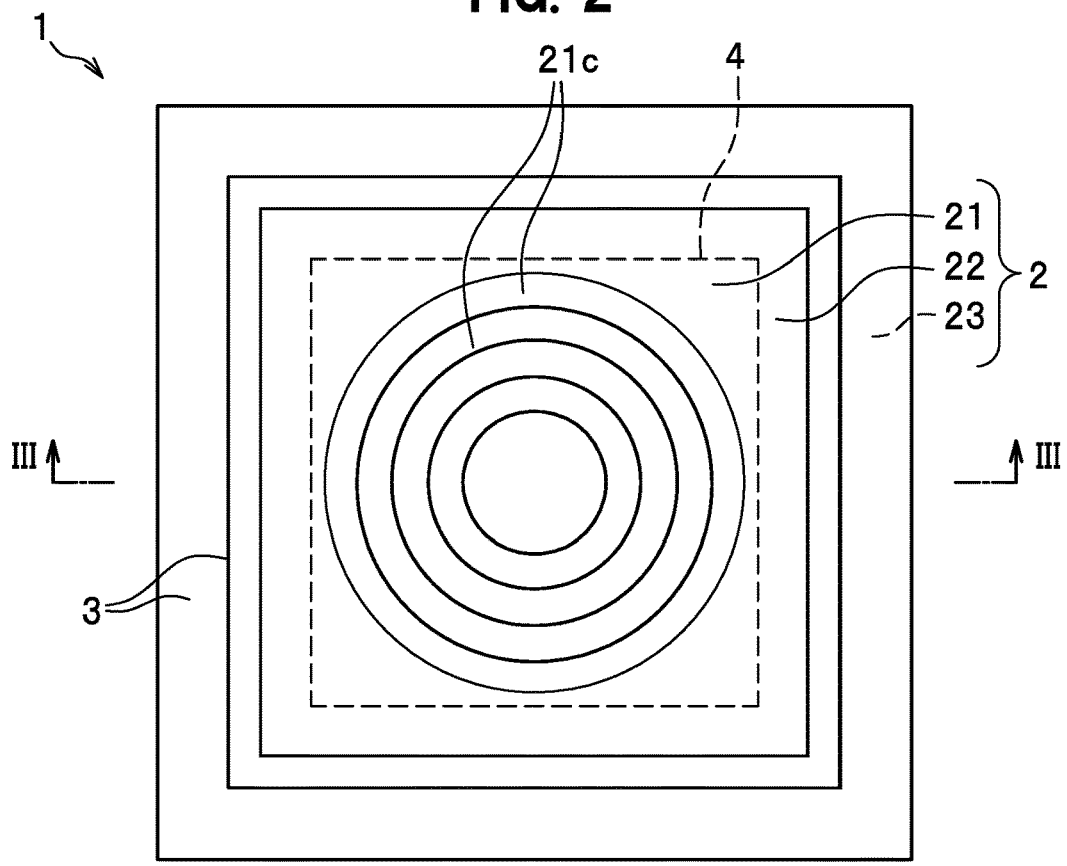
FIG. 2 is a plan view schematically showing a structure of a lens according to the first embodiment.
Figure 3:
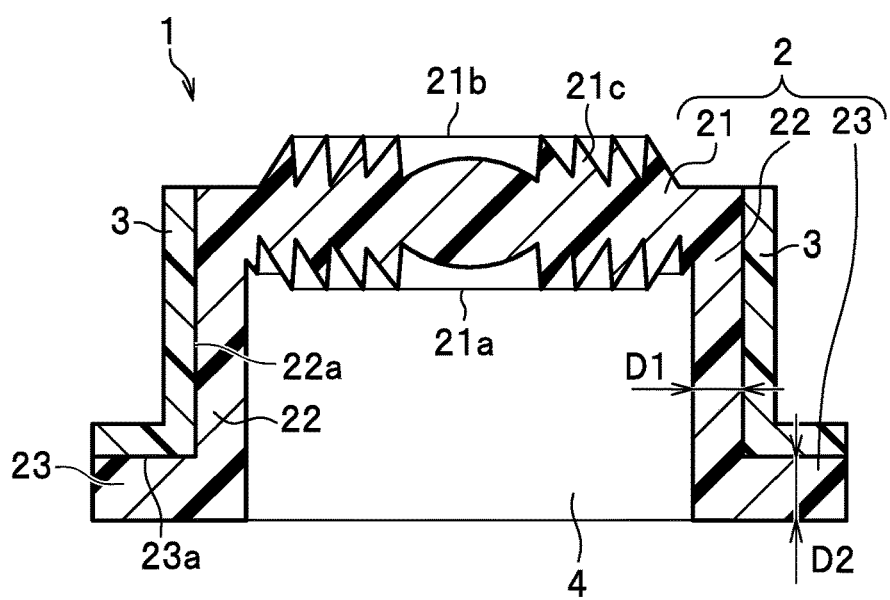
FIG. 3 is a cross-sectional view, taken along line III-III of FIG. 2, schematically showing a structure of a lens according to the first embodiment, in which the line is passing through the center of the lens
Figure 4:
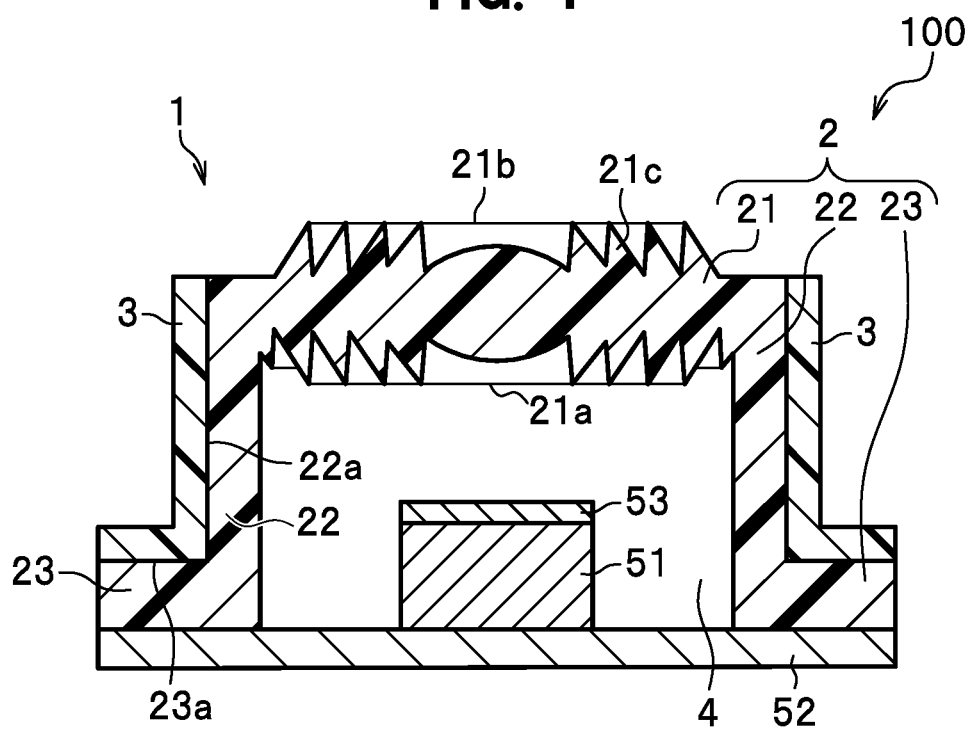
FIG. 4 is a cross-sectional view schematically showing a structure of a light emitting device according to the first embodiment, taken along a line passing through the center of the light emitting device.

FIG. 1 is a perspective sectional view schematically showing a structure of a light emitting device that includes a lens according to a first embodiment, taken along a line passing through the center of the light emitting device. FIG. 2 is a plan view schematically showing a structure of a lens according to the first embodiment. FIG. 3 is a cross-sectional view, taken along line of FIG. 2, schematically showing a structure of a lens according to the first embodiment, in which the line is passing through the center of the lens. FIG. 4 is a cross-sectional view schematically showing a structure of a light emitting device according to the first embodiment, taken along a line passing through the center of the light emitting device.

The light emitting device 100 includes a light emitting element 51 and a lens 51. The light emitting device 100 further includes a base 52 on which the light emitting element 51 is mounted.

Lens

Lens 1 will be described.

The lens 1 includes a cover part 2 and a light-shielding part 3.

The cover part 2 of the lens 1 includes a lens part 21 having one or more lateral sides, a connection part 22 constituting one or more lateral side walls each extending downward from a respective one of the one or more lateral sides of the lens part 21, and a flange part 23 extending outward from a lower-end portion of a corresponding one of the lateral side walls constituted by the connection part 22. The lens part 21 and the connection part 22 are formed of a thermosetting first resin and continuous to one another. The light-shielding part 3 of the lens 1 covers outer lateral surfaces of the lateral side walls constituted by the connection part 22 (and an upper surface of the flange part) and formed of a thermosetting second resin having a greater light-absorptance or a greater light-reflectance than the thermosetting first resin. The lens 1 is, for example, used as a flash lens for a cellular phone or the like.

Cover Part

The cover part 2 includes a lens part 21, a flange part 23, and a connection part 22, which are formed of a thermosetting first resin and continuous to one another. In the cover part 2, the lens part 21 and the connection part 22 define a recess 4 having an opening facing downward, the lens part defines a bottom surface of the recess, and the connection part defines lateral surfaces of the recess. The lateral surfaces of the recess defines the opening of the recess. The flange part 23 extends outward from a periphery of the opening of the recess 4.

The lens part 21 is a member through which light from the light emitting element 51 can be emitted to the outside in parallel light, condensed light, or diffused light. The lens part 21 includes a light emitting surface 21a where light emitted from the light emitting element 51 enters, and a light emitting surface 21b at an opposite side to the light incidence surface 21a where the incident light is refracted and is emitted to the outside.

The outer shape in a plan view of the lens part 21 can be selected from various appropriate shapes, examples thereof include a polygonal shape such as a quadrangular shape, a hexagonal shape, and an octagonal shape, a circular shape and an elliptic shape. A center portion of the lens part 21 serves as a lens preferably has a circular shape or an elliptic shape, where a circular shape is more preferable. The lens part 21 has a maximum thickness of, for example, in a range of 0.1 mm to 10 mm, preferably in a range of 0.5 mm to 5 mm.

For the lens part 21, a Fresnel lens, a total internal reflection (TIR) lens, or the like can be used, in which, a Fresnel lens is preferable. The Fresnel lens 21 may have either a single lens-center or a plurality of lens-centers. When a plurality of Fresnel lenses 21 are employed, the Fresnel lenses are arranged corresponding to the arrangement of the light emitting element 51, such that an odd number of Fresnel lenses are preferably arranged in a zigzag form, and an even number of Fresnel lenses are preferably arranged in a square matrix form.

The Fresnel lens 21 includes a plurality of concentric circles of ridges 21c on the light incidence surface 21a and on the light emitting surface 21b. When combined, the cross-sectional shapes of the plurality of ridges 21c form a curved surface of a single convex lens. The plurality of ridges 21c are preferably arranged in concentric circles or concentric ellipsoids in a radial direction of the Fresnel lens 21. In the Fresnel lens 21, the base plane of the plurality of ridges 21c can be flat, or concave or convex.

Each of the ridges 21c has a cross-sectional shape formed with a straight portion at the center-side and a segment of a curved surface of a lens at the outer-side. The profile of each of the ridges 21c may be formed with inwardly curved segment either a concave curve or a convex curve, in conformity to the direction of light to be emitted. The angles (Fresnel angles) at the tips of the ridges 21c are adjusted such that light from the light emitting element 51 is emitted to the outside in parallel light.

The connection part 22 constitutes lateral side walls each extending downward from a respective one of the lateral sides of the lens part 21 such that an upper end portion of each side wall is contiguous to an upper end portion of the respective one of the lateral sides of the lens part 21, that the side walls constituted by the connection part 22 extend downward in a right angle with respect to the lens part 21, and that a lower-end portion of the side walls of the connection part 22 is contiguous to the flange part 23 in, for example, a right angle. The connection part 22 and the lens part 21 define the recess 4 having the opening facing downward to accommodate a light emitting element 51. In a cross-sectional view, the recess 4 is preferably of a rectangular U-shape, but a semicircular shape or a semi-elliptical shape can also be employed. The connection part 22 is preferably formed such that the lens part 21 is located at a center of a bottom surface of the recess 4. The lens part 21 has a rectangular outer peripheral shape in a plan view and the connection part 22 is disposed with respect to each side of the rectangular shape, with the opposite sides of the connection part 22 being in parallel to each other. The connection part 22 has a thickness smaller than a thickness of the flange part 23. When the connection part 22 is formed with a thickness smaller than a thickness of the flange part 23, the thickness of the connection part 22 can be, for example, preferably in a range of 30 µm to 100 µm, more preferably in a range of 30 µm to 200 nm.

The flange part 23 is formed continuous to and protruding outward from and perpendicular to a lower end portion of corresponding one of the lateral side walls constituted by the connection part 22. The flange part 23 has a thickness greater than a thickness of the connection part 22. The flange part 23 has a frame-like shape and formed along the lateral side walls of the connection part 22 such that the flange part 23 entirely surrounds a lower-end portion of an outer periphery of the lateral side walls constituted by the connection part 22 as shown in FIGS. 1 and 2, and is used for bonding or securing to a substrate 52 on which the light emitting element 51 is mounted. Incidentally, note that the flange part 23 may be constituted by one or more separate parts extending from and partially surrounding the lower-end portion of the outer periphery of the lateral side walls constituted by the connection part 22. That is, each of the one or more separate parts of the flange part 23 may be formed at least along a portion of the lower-end portion of the outer periphery of the lateral side walls constituted by the connection part 22.

More specifically, the flange part 23 has a thickness (D2) greater than a thickness (D1) of the connection part 22 (D1<D2) and also greater than 30 µm. The flange part 23 has a thickness in a range greater than 30 µm to 1000 µm, preferably in a range of 50 to 1000 µm or, more preferably in a range of 100 µm to 1000 µm, further preferably in a range greater than 200 µm to 1000 µm. Thus, the flange part 23 has a thickness greater than the thickness of the connection part 22, which allows for stable connection of the lens 1 to an engaging part 54 (for example, shown in FIG. 7A).

The length of the flange part 23 protruding outward from the lower end portion of the lateral side walls constituted by the connection part 22 is preferably in a range of 200 µm to 3000 µm, more preferably in a range of 200 µm to 1000 µm. With this arrangement, stable bonding or securing between the flange part 23 and the substrate 52 can be obtained. This arrangement can also facilitate bonding with the substrate 52, when applying an adhesive material on the flange part 23.

The thickness (D2) of the flange part 23 with respect to the thickness (D1) of the connection part 22 can be 1.1 times or greater, preferably 1.2 times or greater, more preferably 1.5 times or greater, and 3 times or less, preferably 2.5 times or less, more preferably 2 times or less.

The thermosetting first resin used to form the cover part 2 is a light-transmissive thermosetting resin. Examples of the thermosetting resin include phenol resin, urea resin, melamine resin, epoxy resin, silicone resin, and polyurethane resin, and silicone resin is preferable. The use of a thermosetting resin that is more resistant to light and heat than a conventionally used thermoplastic resin such as polycarbonate resin can reduce degradation of the cover part 2, and further can reduce degradation with the lapse of time, in which light and heat concentrate in portions discolored by degradation, where darkening of the cover part 2 progresses in an accelerative manner. Moreover, silicone resin exhibits high flowability when heated, which allows molding of the flange part 23 with a greater thickness.

Light-Shielding Part

The light-shielding part 3 is applied to cover outer lateral surfaces 22a of the lateral side walls constituted by the connection part 22 and an upper surface 23a of the flange part 23, and is formed of a thermosetting second resin having a greater light-absorptance or a greater light-reflectance than the thermosetting first resin.

The light-shielding part 3 is formed in a shape corresponding to the shapes of the connection part 22 and the flange part 23, with a substantially uniform thickness. More specifically, the light-shielding part 3 has a shape in cross section corresponding to the shapes of the outer lateral surface 22a of the lateral side walls constituted by the connection part 22 and the upper surface 23a of the flange part 23, which is, for example, an L-shape. The thickness of the light-shielding part 3 that is a thickness in a direction normal to the corresponding one of the lateral side walls constituted by the connection part 22 or normal to the flange part 23 is preferably in a range of 200 µm to 3,000 µm, more preferably in a range of 250 µm to 2,000 µm. With this arrangement, the outer lateral surfaces 22a of the lateral side walls constituted by the connection part 22 and the upper surface 23a of the flange part 23 can be reliably covered by the light-shielding part 3, such that leaking of light through the outer lateral surfaces 22a of the lateral side walls constituted by the connection part 22 and the upper surface 23a of the flange part 23 can be substantially prevented. The light-shielding part 3 is disposed on the outer lateral surfaces 22a of the lateral side walls constituted by the connection part 22 and on the upper surface 23a of the flange part 23 without using an adhesive material. Because an adhesive material is not used, degradation or detachment of the adhesive material, and/or absorption of light by an adhesive material do not occur.

The thermosetting second resin used to form the light-shielding part 3 is a thermosetting resin having a greater light-absorptance or a greater light-reflectance than the light-transmissive first resin. For the thermosetting second resin, a black colored resin or white colored resin of a light-transmissive thermosetting resin similar to that used as the thermosetting first resin, preferably a silicone resin, containing a black color material such as carbon having a high light absorptance, or a white color material such as titanium oxide having a high light reflectance can be used. With this, the connection part 22 formed of the light-transmissive first resin can be covered by the light-shielding part 3 formed of the thermosetting second resin having a high light absorptance or a high light reflectance, such that when the lens 1 is in operation, light from the light emitting element 51 is absorbed or reflected at the light-shielding part 3 and leaking of light in a lateral sides of the lens 1, particularly, through the connection part 22 can be reduced.

Light Emitting Device

Next, the light emitting device 100 will be described.

The light emitting device 100 includes a light emitting element 51, a lens 1, and preferably a substrate 52. A lens part 21 of the lens 1 is arranged at a position such that light from the light emitting element 51 can be transmitted through the lens part 21. The light emitting device 100 may further include a light-transmissive member 53. The light emitting device 100 includes the lens 1 whose outer lateral surfaces are covered by the light-shielding part 3, such that light from the light emitting element 51 is absorbed or reflected by the light-shielding part 3, and thus leaking of light in the lateral sides of the lens 1 can be reduced. The lens 1 is similar to that described above and therefore the description thereof will be appropriately omitted.

Light Emitting Element

The light emitting element 51 preferably include at least a nitride-based semiconductor layered structure. The nitride-based semiconductor layered structure includes a first semiconductor layer (for example, an n-type semiconductor layer), a light emitting layer, and a second semiconductor layer (for example, a p-type semiconductor layer) layered in this order, which configured to generate light. The nitride-based semiconductor layered structure has a thickness of preferably 30 µm or less.

The first semiconductor layer, the light-emitting layer, and the second semiconductor layer can be respectively an appropriate type, made of appropriate materials. Examples thereof include a Group III-V compound semiconductor and a Group II-VI compound semiconductor. More specific examples include nitride-based semiconductor materials such as $In_XAl_YGa_{1-X-Y}N$ ($0 \leq X$, $0 \leq Y$, $X+Y \leq 1$); for example, InN, AlN, GaN, InGaN, AlGaN, InGaAlN, or the like. For the thickness and structure of each of the layers, any appropriate thickness and structure known in the art can be employed. The light emitting element 51 generally has a quadrangular shape in a plan view, but can have any appropriate shape such as a circular shape, an elliptical shape, or a polygonal shape such as a triangular shape, a quadrangular shape, or a hexagonal shape.

Light-Transmissive Member

It is preferable that an upper surface of the light emitting element 51 is covered by a light-transmissive member 53 disposed by using a spraying method or the like. The light-transmissive member 53 is configured to protect the light emitting element 51 from an external force, dust, moisture, or the like, and also to improve heat-resisting properties, weather resistant properties, and light-resisting properties of the light emitting element 51. It is preferable that the sealing member can transmit 60% or greater light emitted from the light emitting layer. Such a light-transmissive member 53 can be formed of a thermosetting resin, a thermoplastic resin, a modified resin of such a resin, a hybrid resin which includes one or more of those resins, or the like.

More specifically, an epoxy/modified epoxy resin, a silicone/modified silicone/hybrid silicone resin, or the like can be used.

In order to adjust the color of emitted light, the light-transmissive member 53 preferably contains a fluorescent material to convert the wavelength of light from the light emitting element 51. For the fluorescent material, a known material in the art can be used. Examples of the fluorescent material include yttrium aluminum garnet (YAG)-based fluorescent material activated with cerium.

The light-transmissive member 53 may contain a filler material (for example, a diffusion agent, a coloring agent, or the like). Examples of the filler material include silica, titanium oxide, zirconium oxide, magnesium oxide, glass, a crystal or sintered body of a fluorescent material, and a sintered body of a fluorescent material and an inorganic binding material.

Substrate

The substrate 52 is configured to mount a light emitting element 51, and for example, includes a base material made of such as sapphire, spinel, or SiC, and a wiring pattern formed on or/and in the base material.

The light emitting element 51 is preferably flip-chip mounted on the substrate 52. On the substrate 52, either a single or a plurality of light emitting elements 51 can be mounted. When a plurality of light emitting element 51 is mounted on the substrate 52, the light emitting elements 51 may be arranged irregularly, or arranged regularly such as in rows and columns, or periodically. The type of connection used in connecting the plurality of light emitting elements 51 can be in series, in parallel, in series-parallel or in parallel-series.

Arrangement of Light Emitting Element and Lens

The lens 1 is disposed such that the lens part 21 is at a position that allows light from the light emitting element 51 to be transmitted through the lens part 21. The lens 1 is disposed on the base 52 through the flange part 23, with the lens part 21 facing the light emitting element 51. Accordingly, the lens 1 is disposed on the substrate 52 with the lens part 21 facing the light emitting element 51, such that light from the light emitting element 51 leaking through the flange part 23 in lateral sides of the lens 1 can be reduced.

The light emitting element 51 is arranged spaced apart from the lens part 21 and the connection part 22. More specifically, a depth of the recess 4 defined by the lens part 21 and the lateral side walls constituted by the connection part 22 is in a range of about 0.4 mm to 1.5 mm. Accordingly, a gap between the bottom surface of the recess 4 and the upper surface of the light emitting element 51 is in a range of about 0.05 mm to 0.5 mm. With this arrangement, heat from the light emitting element 51 can be prevented from directly conducted to the lens part 21, and thermal degradation of the lens part 21 can be reduced.

In the lens 1, the connection part 22 is formed such that a distance from the lens part (Fresnel lens) 21 to the light emitting element 51 is smaller than a distance from the connection part 22 to the light emitting element 51. In the lens 1, a recess 4 is defined by the lens part (Fresnel lens) 21 and the connection part 22 such that a distance from the lens part (Fresnel lens) 21 to the light emitting element 51 is smaller than a distance from the connection part 22 to the light emitting element 51. More specifically, the center of the light emitting element 51 (or a geometrical center of the light emitting element 51) is facing the center of the Fresnel lens 21 (or a geometrical center of the Fresnel lens 21). In other words, the lens 1 is disposed such that the center of the ridges 21c of the lens 1 arranged in concentric circles or concentric ellipsoids and the center of the light emitting element 51 are aligned. When the lens includes a plurality of lens parts 21, that is, when the lens is a compound eye lens, the light emitting element 51 may be arranged with a shift such that the center of the light emitting element 51 is closer to the center of the entire lens. With the arrangements of the light emitting element 51 described above, a certain gap can be maintained between the light emitting element 51 and the connection part 22 and between the light emitting element 51 and the flange part 23, such that light of the light emitting element 51 passing through the flange part 23 can be reduced.

The lens 1 has the flange part 23 with a thickness (D2) greater than a thickness (D1) of the connection part 22 (D1<D2), which allows reliable connection with an engaging part 54 (for example shown in FIG. 7A) provided at an outer side with respect to the designated disposing location of the lens 1.

Method of Manufacturing Lens

Figure 5:
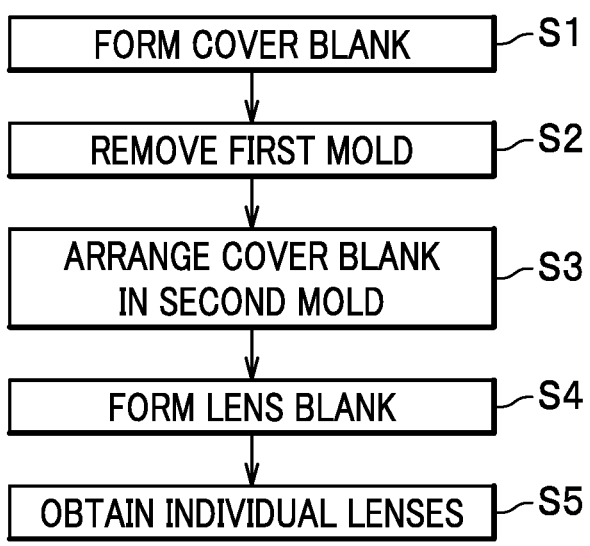
FIG. 5 is a flow chart showing a procedure of a method of manufacturing a lens according to the first embodiment.
Figure 6A:
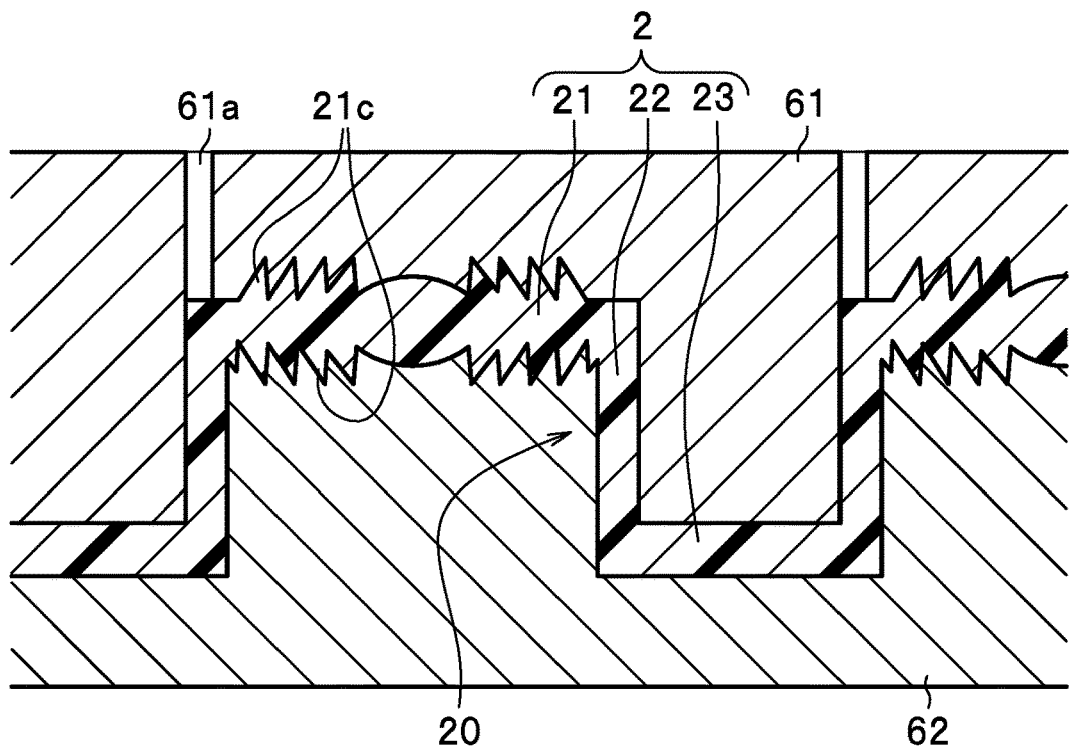
FIG. 6A is a cross-sectional view schematically illustrating forming a cover blank in a method of manufacturing a lens according to the first embodiment.
Figure 6B:
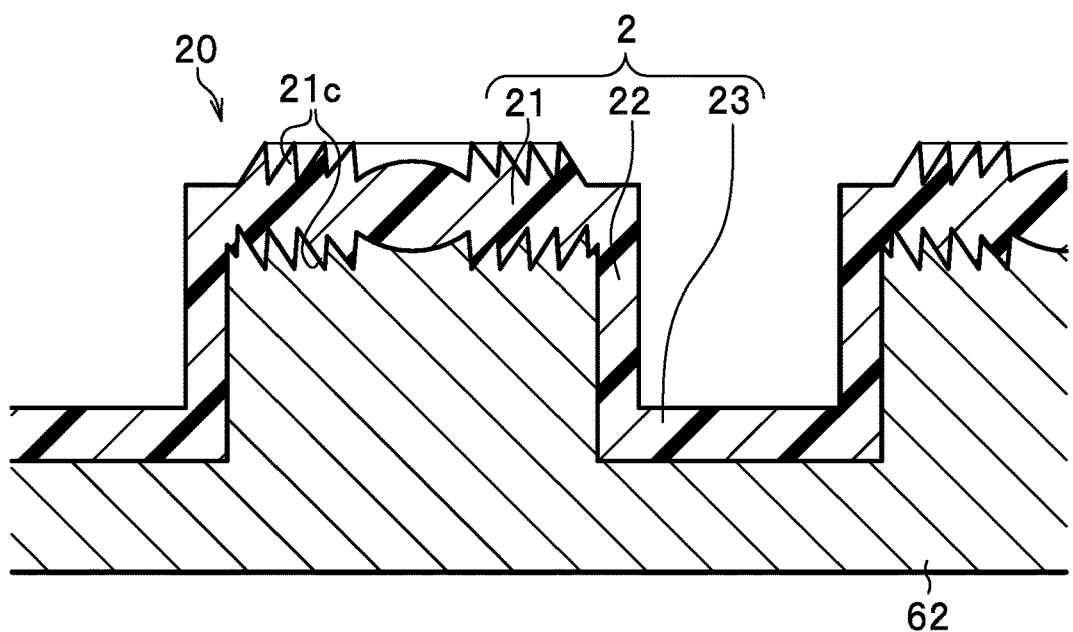
FIG. 6B is a cross-sectional view schematically showing removing a first mold in a method of manufacturing a lens according to the first embodiment.
Figure 6C:
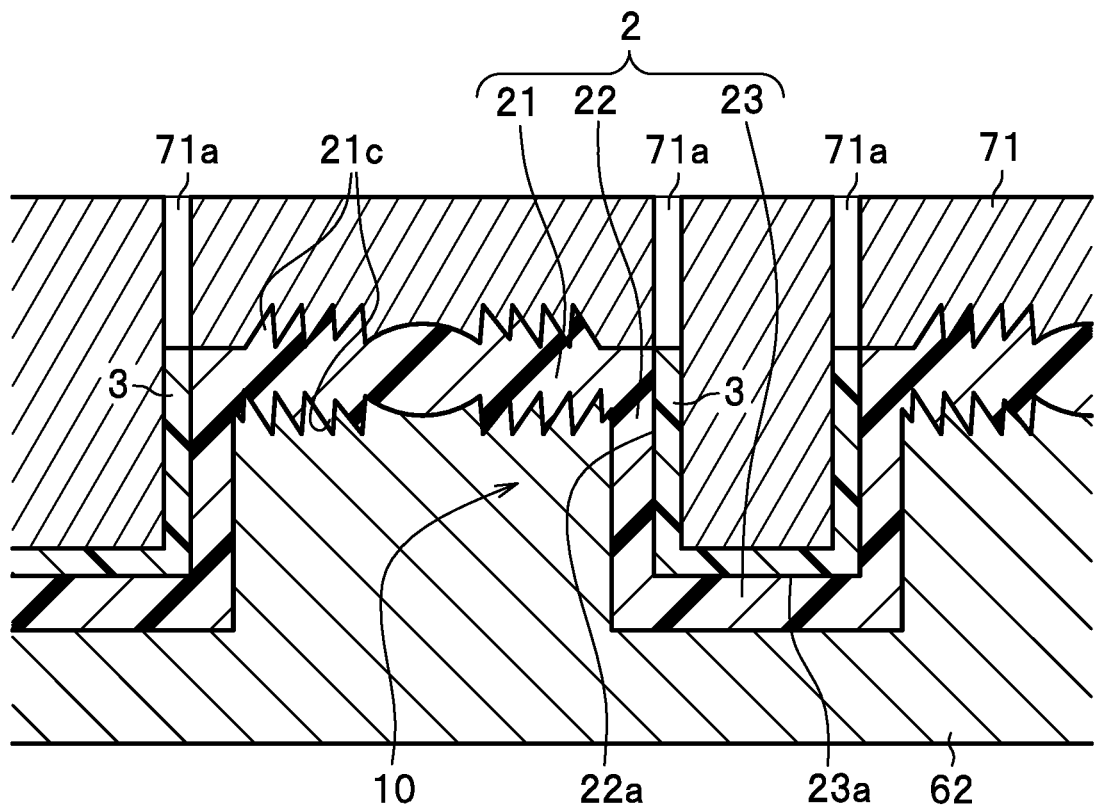
FIG. 6C is a cross-sectional view schematically illustrating arranging a cover blank in a second mold and forming a lens blank in a method of manufacturing a lens according to the first embodiment.
Figure 6D:
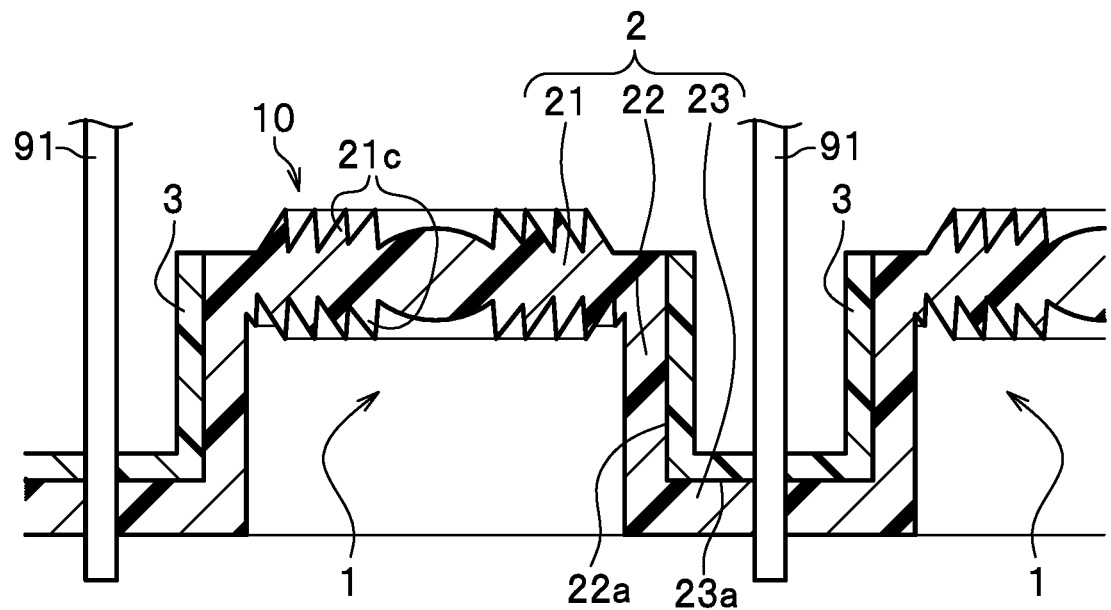
FIG. 6D is a cross-sectional view schematically illustrating cutting the lens blank to obtain individual lenses in a method of manufacturing a lens according to the first embodiment.

Next, a method of manufacturing a lens will be described. FIG. 5 is a flow chart showing a procedure of a method of manufacturing a lens according to the first embodiment. FIG. 6A is a cross-sectional view schematically illustrating forming a cover blank in a method of manufacturing a lens according to the first embodiment. FIG. 6B is a cross-sectional view schematically showing removing a first mold in a method of manufacturing a lens according to the first embodiment. FIG. 6C is a cross-sectional view schematically illustrating arranging a cover blank in a second mold and forming a lens blank in a method of manufacturing a lens according to the first embodiment. FIG. 6D is a cross-sectional view schematically illustrating cutting a lens blank to obtain individual lenses in a method of manufacturing a lens according to the first embodiment.

Although FIG. 6A to FIG. 6D illustrate manufacturing of a plurality of lenses, manufacturing of a single lens will be described below, and corresponding description of manufacturing adjacent lenses will be appropriately omitted.

The method of manufacturing a lens 1 includes forming (S1) a cover blank, removing (S2) a first mold, arranging (S3) the cover blank in a second mold, forming (S4) a lens blank, and obtaining (S5) individual lenses, which are performed in this order. Accordingly, the lens 1 allowing for a reduction of leakage of light can be obtained. Forming the cover blank 20 with a thickness (D1) of the connection part 22 smaller than a thickness (D2) of the flange part 23, the lens 1 can be stably connected to an outer engaging part 54 (shown in FIG. 7A).

The description of material and arrangement etc., of each member are as in the lens 1 and therefore the description thereof will be appropriately omitted.

Forming Cover Blank

In forming (S1) a cover blank, a thermosetting first resin is injected in a first mold and cured to form a cover blank 20 having a plurality of cover parts 2 each having a lens part 21 having lateral sides, a connection part 22 constituting lateral side walls each extending downward from a respective one of the lateral sides of the lens part 21, and a flange part 23 extending outward from a lower-end portion of the lateral side walls constituted by the connection part 22. The lens part 21, the connection part 22, and the flange part 23 are formed continuous with one another.

In the forming (S1) a cover blank, an upper mold 61 and a lower mold 62 adapted for transfer molding are used as the first mold. The upper mold 61 and the lower mold 62 are closed, the thermosetting first resin, which is heated and softened, is injected under pressure into the first mold through a resin injecting port 61a formed in the upper mold 61. The thermosetting first resin is cured in the heated mold, such that a cover blank 20 having a plurality of cover parts 2 connected one another at the flange part 23 is molded.

In the forming (S1) a cover blank, the upper mold 61 and the lower mold 62 are designed to produce a cover blank 20 having the plurality of cover parts 2 each formed with a recess having an opening facing downward, which is defined by the lens part 21 and the connection part 22 and is located inward of the flange part 23. Further, in the forming (S1) a cover blank, the upper mold 61 and the lower mold 62 are designed to produce a cover blank 20 having a plurality of cover parts 2, a respective one of which has a lens part 21 having a plurality of ridges 21c on both sides, with the flange part 23 having a thickness (D2) greater than a thickness (D1) of the connection part 22, for example, a thickness of the flange part 23 greater than 30 μm.

Removing First Mold

In the removing (S2) the first mold, a part or all parts of the first mold is removed after the cover blank 20 is formed. In the first embodiment, the upper mold 61 that is a part of the first mold is removed and the cover blank 20 is held by the lower mold 62.

Arranging Cover Blank in Second Mold

In the arranging (S3) the cover blank in the second mold, another upper mold 71 which is also adapted for transfer molding is arranged on the lower mold 62 holding the cover blank 20. In the arranging (S3) the cover blank in the second mold, the upper mold 71 and the lower mold 62 are used as the second mold.

Forming Lens Blank

In the forming (S4) a lens blank, a thermosetting second resin having a greater light-absorptance or a greater light-reflectance than the thermosetting first resin is injected in the second mold and cured, to form a lens blank 10 having a light-shielding part 3 between adjacent cover parts 2.

In the forming (S4) a lens blank, the upper mold 71 and the lower mold 62 are closed, and the thermosetting second resin, which is heated and softened, is injected under pressure into the second mold through a resin injecting port 71a formed in the upper mold 71. The thermosetting second resin is cured in the heated mold, such that a lens blank 10 having a light-shielding part 3 between adjacent cover parts 2, in a bent shape in a cross-section that is in conformity to the shapes of the outer lateral surfaces 22a of the lateral side walls constituted by the connection part 22 and the upper surface 23a of the flange part 23 is molded.

Obtaining individual Lenses

As shown in FIG. 6D, in the obtaining (S5) individual lenses, the lens blank 10 is singulated into individual lenses 1. That is, in the obtaining (S5) individual lenses, all parts of the second mold are removed to take out the lens blank 10, and the lens blank 10 is cut along a center of the light-shielding part 3 between adjacent cover parts 2. The singulating is performed by cutting at the light-shielding part 3, thus obtaining individual lenses 1 each having the light-shielding part 3 covering the outer lateral surfaces of the lateral side walls constituted by the connection part 22 and the upper surface 23a of the flange part 23.

Further, in the obtaining (S5) individual lenses, a center of the light-shielding part 3 between outer lateral surfaces 22a of the lateral side walls constituted by two adjacent connection parts 22 of the lens blank 10 is cut together with the flange part 23 to obtain an individual lens 1 having the outer lateral surfaces 22a of the lateral side walls constituted by the connection part 22 and the upper surface 23a of each of the one or more flange parts 23 covered by the light-shielding part 3. In a cross-section, the light-shielding part 3 of each of the individual lenses 1 has a rectangular shape in conformity to the shapes of the outer lateral surfaces 22a of the lateral side walls constituted by the connection part 22 and the upper surface 23a of the flange part 23. Cutting of the light-shielding part 3 can be performed by using a cutting tool 91 such as a blade or the like known in the art. It is preferable to adjust the cutting width of the cutting tool 91 such that the flange part 23 of the lens 1 has a length in a range of 200 μm to 1,000 μm.

Method of Manufacturing Light Emitting Device

Next, a method of producing a light emitting device 100 will be described. Although the method of manufacturing the light emitting device 100 is not shown in the drawings, the method will be described with reference to FIG. 1 and FIG. 4 that show the structure of the light emitting device 100.

The method of manufacturing the light emitting device 100 includes providing a lens and disposing the lens with respect to the light emitting element that has been positioned.

The providing a lens is similar to that described in the method of manufacturing a lens and therefore the description thereof will be appropriately omitted.

Disposing Lens

In the disposing a lens, the lens 1 is disposed such that light from the light emitting element 51 to be transmitted through the lens part 21 of the lens 1. In the disposing a lens, the lens 1 is disposed such that the light emitting element 51, which is preferably has been mounted on a substrate 52, is accommodated in the recess 4 having an opening facing downward. The recess 4 is defined by the lens part 21 and the connection part 22. The lens part 21 defines a bottom surface of the recess 4 and the connection part 22 defines lateral surface(s) of the recess 4. The lateral surface(s) define the opening of the recess 4. The opening of the recess 4 is located inward of the flange part 23. The light emitting element 51 may be covered by a light-transmissive member 53.

In the disposing a lens, it is preferable that the light emitting element 51 is mounted on a substrate 52, in which the light emitting element 51 is flip-chip mounted on the substrate 52 by using soldering. It is preferable that after the light emitting element 51 is mounted on the substrate 52, the flange part 23 is connected to the substrate 52. In the disposing a lens, the lens 1 is disposed such that the connection part 22 and the lens part 21 of the lens 1 are spaced apart from the light emitting element 51. More specifically, a gap between the bottom surface of the recess 4 and the upper surface of the light-transmissive member 51 or the upper surface of the light-transmissive member 53 is preferably in a range of 0.05 mm to 0.5 mm. Further, in the disposing a lens, the connection part 22 (recess 4) is preferably formed such that a distance from the lens part 21 to the light emitting element 51 is smaller than a distance from the connection part 22 to the light emitting element 51. More specifically, the center of the light emitting element 51 (or a geometrical center of the light emitting element 51) is preferably aligned with the center of the lens part (the Fresnel lens) 21 (or a geometrical center of the lens part (Fresnel lens) 21), that is, aligned with the centers of the ridges 21c arranged in concentric circles or concentric ellipsoids.

Figure 7A:
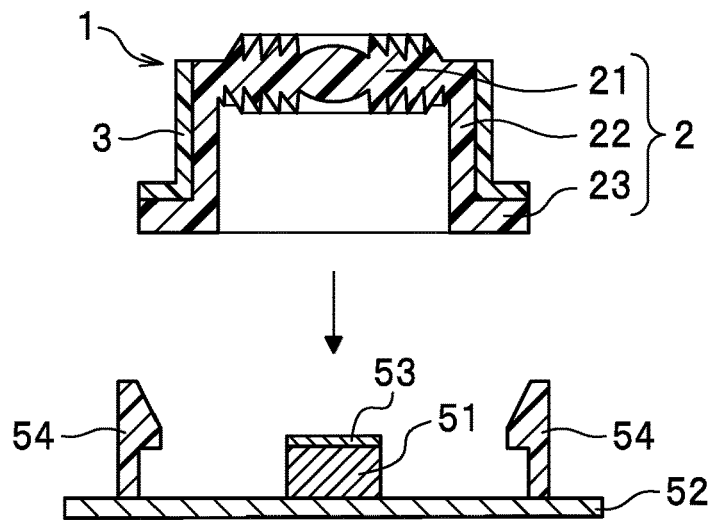
FIG. 7A is a cross-sectional diagram illustrating a state of arranging a lens according to the first embodiment via an engaging member with respect to a substrate having a light emitting element mounted thereon.
Figure 7B:
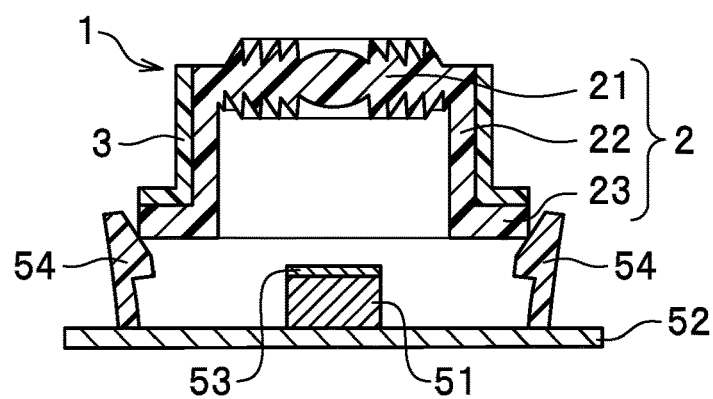
FIG. 7B is a cross-sectional diagram illustrating a state of engaging a flange part of a lens according to the first embodiment with an engaging member.
Figure 7C:
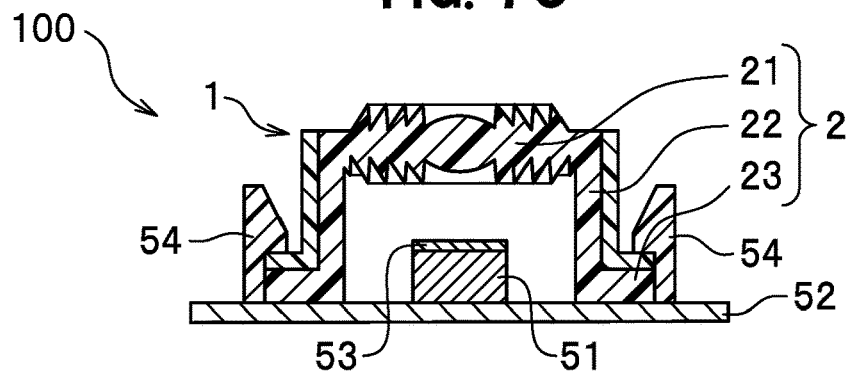
FIG. 7C is a cross-sectional view illustrating a state the lens according to the first embodiment disposed on the substrate, with the flange part of the lens engaged with the engaging member.

When the lens 1 is disposed such that the light emitting element 51 is accommodated in the recess 4, the lens 1 may be disposed via an engaging part 54 as shown in FIG. 7A to FIG. 7C. FIG. 7A is a schematic cross-sectional diagram illustrating a state of arranging a lens according to the first embodiment via an engaging member with respect to a substrate having a light emitting element mounted thereon. FIG. 7B is a cross-sectional diagram illustrating a state of engaging a flange part of a lens according to the first embodiment with an engaging member. FIG. 7C is a schematic cross-sectional view illustrating a lens arranged on a substrate, in which a flange part of a lens according to the first embodiment is engaged with an engaging part. The substrate 52 may be provided beforehand with the engaging part 54 at a predetermined location around the light emitting element 51. The engaging part 54 has an inwardly projecting end portion and a shaft portion, and the end portion has a thickness greater than that of a shaft portion. The engaging part 54 is disposed such that a tip of the inwardly projecting end portion is at a location corresponding to substantially a half of protruding length of the flange part 23. Thus, together with the light-shielding part 3, the flange part 23 can be engaged with the engaging part 54. Either the engaging part 54 or the flange part 23 of the lens 1 is elastically deformed (in FIG. 7B, the engaging part 54 is elastically deformed) to engage the flange part 23 (the flange part 23 and the light-shielding part 3) with the engaging part 54. Thus, the lens 1 is disposed on the substrate 52. In the lens 1, the flange part 23 has a thickness greater than a thickness of the connection part 22, which allows stable attachment to the engaging part 54.

Second Embodiment

Next, a second embodiment will be described with reference to FIG. 8A.

Figure 8A:
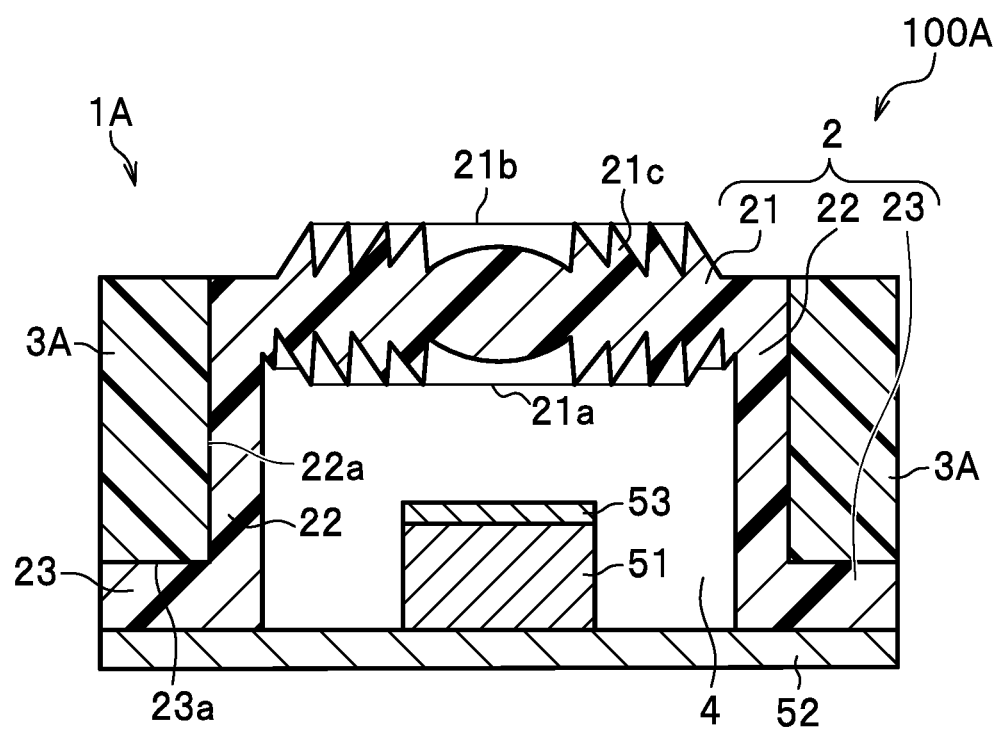
FIG. 8A is a cross-sectional view schematically showing a structure of a light emitting device that includes a lens according to a second embodiment, taken along a line passing through the center of the light emitting device.
Figure 8B:
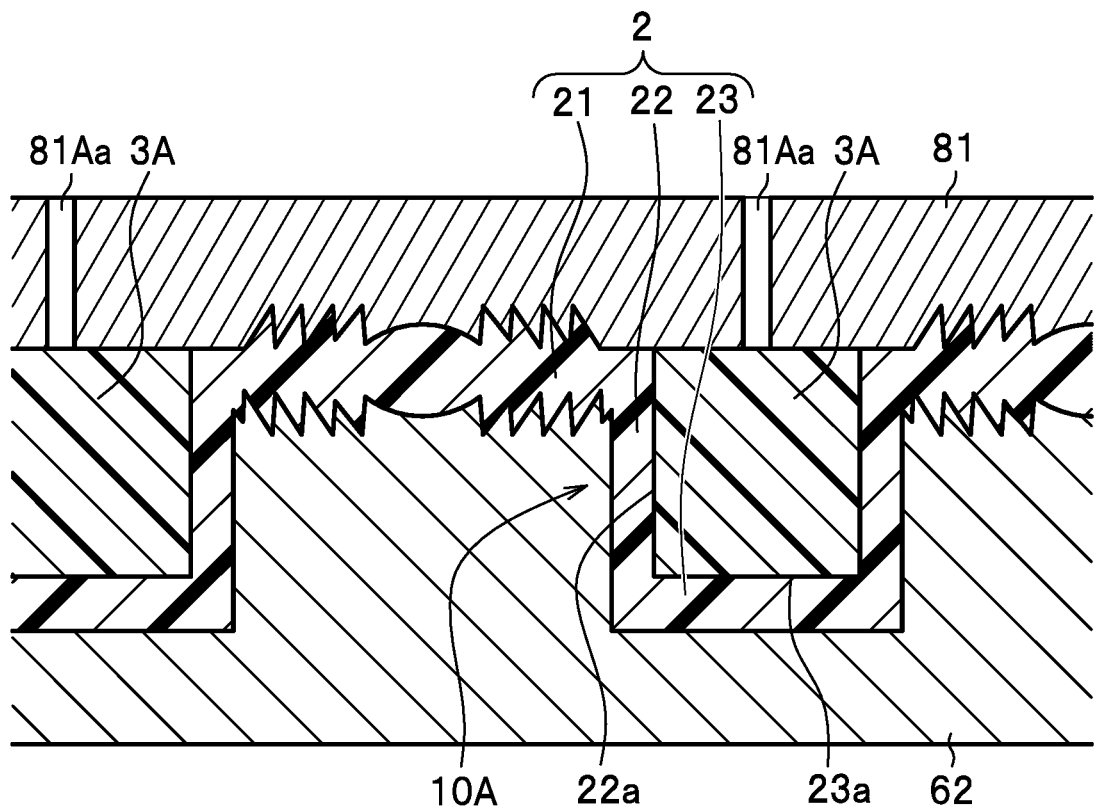
FIG. 8B is a cross-sectional view schematically illustrating arranging a cover blank in a second mold to form a lens blank in a method of manufacturing a lens according to the second embodiment.

FIG. 8A is a cross-sectional view schematically showing a structure of a light emitting device that includes a lens according to a second embodiment, taken along a line passing through the center of the light emitting device. The same reference numerals may be applied to the components that have been described above and description thereof may be appropriately omitted.

Lens and Light Emitting Device

A lens 1A and a light emitting device 100A will be described.

In the lens 1A and the light emitting device 100A according to the second embodiment, a light-shielding part 3A has a large thickness and a rectangular cross-sectional shape which is in conformity to outer lateral surfaces 22a of the lateral side walls constituted by the connection part 22. This is different from the connection part 22 of the first embodiment, which has a cross-sectional shape bent along the shapes of the outer lateral surfaces 22a of the lateral side walls constituted by the connection part 22 and the shape of the upper surface 23a of the flange part 23. Other structures are similar to the lens 1 and the light emitting device 100 according to the first embodiment. The light-shielding part 3A is disposed with the same thickness as the length of the flange part 23 extending outward from the connection part 22. The outer lateral surface of the light-shielding part 3A and the outer end surface of the flange part 23 are flush with each other, which can reduce occurrence of detachment at the interface between the light-shielding part 3A and the flange part 23. The light-shielding part 3A preferably covers an entire outer lateral surfaces 22a of the lateral side walls constituted by the connection part 22.

The lens 1A and the light emitting device 100A according to the second embodiment have the light-shielding part 3A with a larger thickness as described above, and thus leaking of light can be further reduced. Also, the flange part 23 has a larger thickness than that of the connection part 22, which together with the light-shielding part 3A, can enhance mechanical strength, such that when the cover part 2 is bonded to the substrate 52 via an adhesive material, stable bonding can be obtained.

Obtaining Individual Lenses

Next, a method of obtaining individual lenses 1A will be described.

Figure 8C:
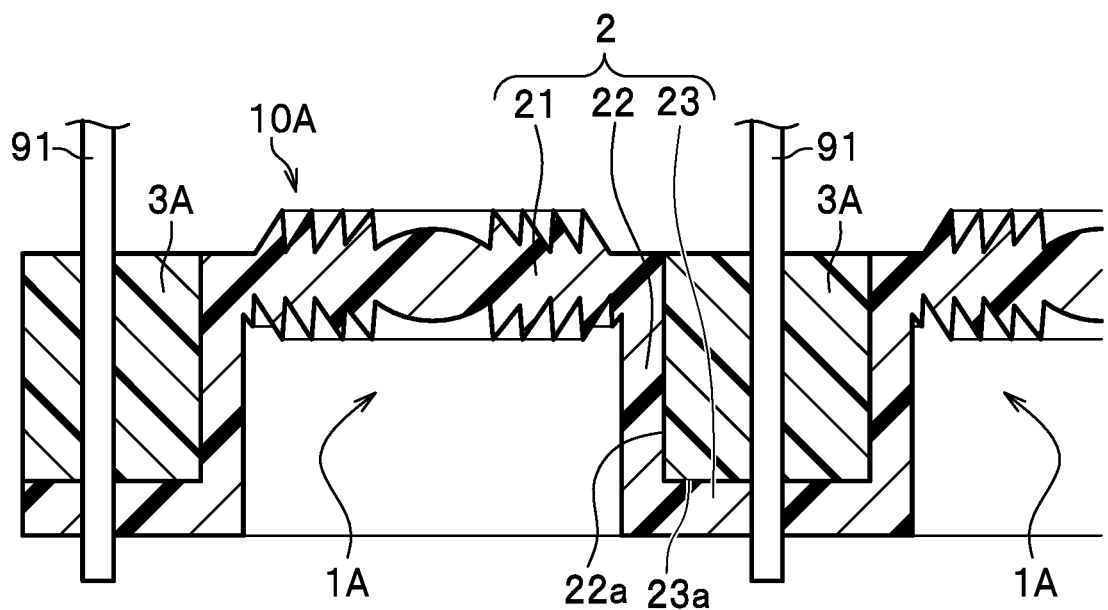
FIG. 8C is a cross-sectional view schematically illustrating cutting the lens blank to obtain individual lenses in a method of manufacturing a lens according to the second embodiment.

FIG. 8A is a cross-sectional view schematically illustrating forming a cover blank in a method of manufacturing a lens according to the second embodiment. FIG. 8C is a cross-sectional view schematically illustrating cutting a lens blank into individual lenses in a method of manufacturing a lens according to the second embodiment.

The obtaining individual lenses 1A includes, similar to that in the obtaining individual lenses according to the first embodiment, forming (S1) a cover blank, removing (S2) a first mold, arranging (S3) the cover blank in a second mold, forming (S4) a lens blank, and obtaining (S5) individual lenses, which are performed in this order. The first mold and the second mold are designed such that the flange part 23 has a thickness greater than that of the connection part 22.

The obtaining individual lenses 1A is similar to the obtaining individual lenses 1 according to the first embodiment except that, in the arranging (S3) a cover blank 20 in the second mold, the cover blank 20 is arranged in a second mold (an upper mold 81 and a lower mold 62) that is different from the second mold (the upper mold 71 and the lower mold 62) used in the first embodiment. In the forming (S4) a lens blank, a thermosetting second resin having a greater light-absorptance or a greater light-reflectance than the thermosetting first resin is injected in the second mold and cured, to form a lens blank 10A having a light-shielding part 3A having a rectangular cross-sectional shape that is in conformity to the outer lateral surfaces 22a of the lateral side walls constituted by the connection part 22, between adjacent cover parts 2. The thermosetting second resin is injected from a resin injecting port 81Aa of the upper mold 81A. Further, in the obtaining individual lenses 1A, a center of the light-shielding part 3A between outer lateral surfaces 22a of the lateral side walls constituted by two adjacent connection parts 22 of the lens blank 10A is cut together with the flange part 23 to obtain individual lenses 1A each having the outer lateral surfaces 22a of the lateral side walls constituted by the connection part 22 and the upper surface 23a of the flange part 23 covered by the light-shielding part 3. In a cross-section, the light-shielding part 3A of the individual lens 1A thus obtained has a rectangular shape in conformity to the shape of the outer lateral surface 22a of the connection part 22.

Method of Manufacturing Light Emitting Device

Next, a method of manufacturing a light emitting device 100B will be described.

The method of manufacturing the light emitting device 100B includes providing a lens 1A and disposing the lens 1A which are performed in this order. The method of manufacturing the light emitting device 100B can be performed in a similar manner as in the method of manufacturing the light emitting device 100 according to the first embodiment, except for using the lens 1B.

Third Embodiment

Next, a third embodiment will be described with reference to FIG. 9.

Figure 9:
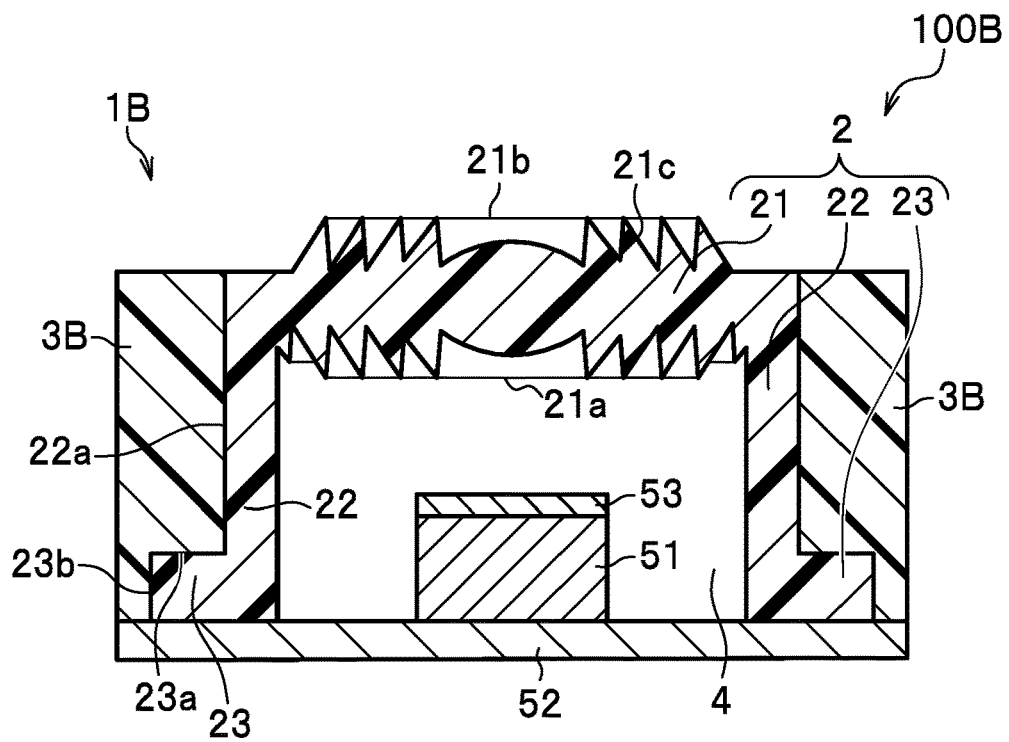
FIG. 9 is a cross-sectional view schematically showing a structure of a light emitting device that includes a lens according to a third embodiment, taken along a line passing through the center of the light emitting device.

FIG. 9 is a cross-sectional view schematically showing a structure of a light emitting device that includes a lens according to a third embodiment, taken along a line passing through the center of the light emitting device. In the description below, the same reference numerals will be applied to the structure of the flexible substrate member 1 and description thereof will be omitted.

Lens and Light Emitting Device

A lens 1B and a light emitting device 100B will be described. A flange part 23 has a thickness greater than a thickness of a connection part 22.

In the lens 1B and the light emitting device 100B according to the third embodiment, a light-shielding part 3B has a thickness greater than the thickness of the light-shielding part 3A of the second embodiment, and the shielding part 3B also covers an outer end surface 23b of the flange part 23. Others are similar to those of the method of manufacturing the lens 1A and the light emitting device 100A, according to the second embodiment.

The lens 1B and the light emitting device 100B according to the third embodiment have the light-shielding part 3B having a greater thickness that covers the outer lateral end surface 23b of the flange part 23, thus yielding a further reduction of leaking light through the light-shielding part 3B.

Method of Manufacturing Lens

Next, a method of manufacturing a light Lens 100B will be described.

Figure 10:
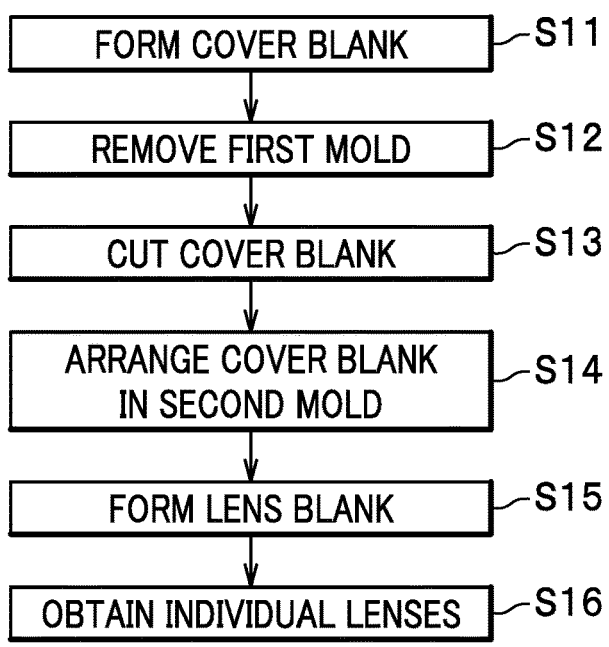
FIG. 10 is a flow chart showing a procedure of a method of manufacturing a lens according to the third embodiment.
Figure 11A:
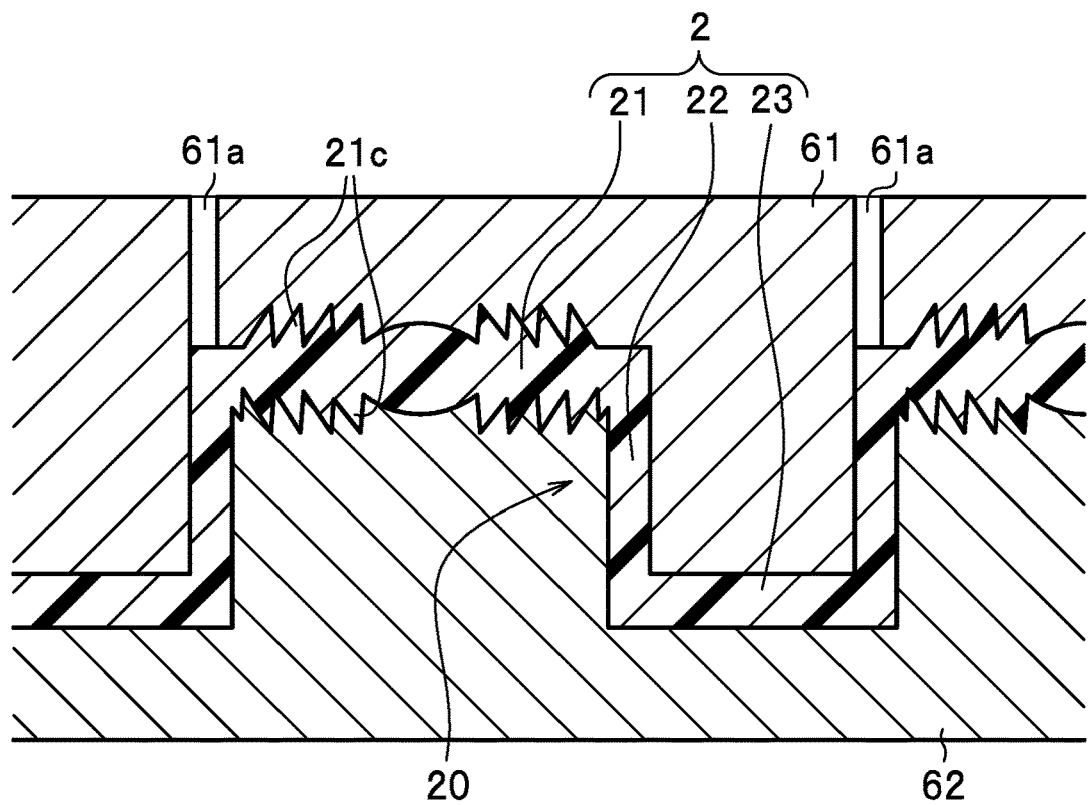
FIG. 11A is a cross-sectional view schematically illustrating forming a cover blank in a method of manufacturing a lens according to the third embodiment.
Figure 11B:
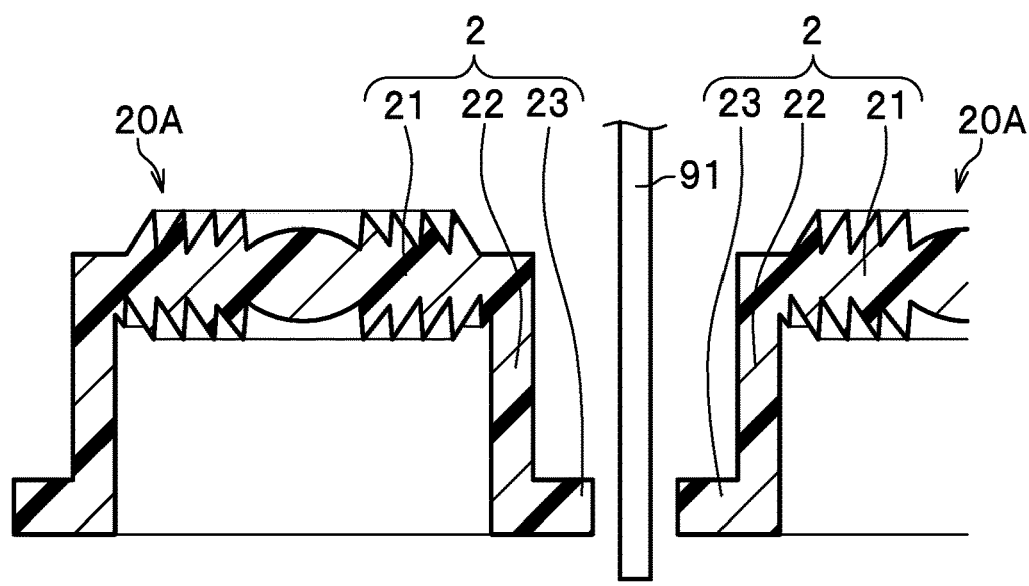
FIG. 11B is a cross-sectional view schematically illustrating cutting a cover blank in a method of manufacturing a lens according to the third embodiment.
Figure 11C:
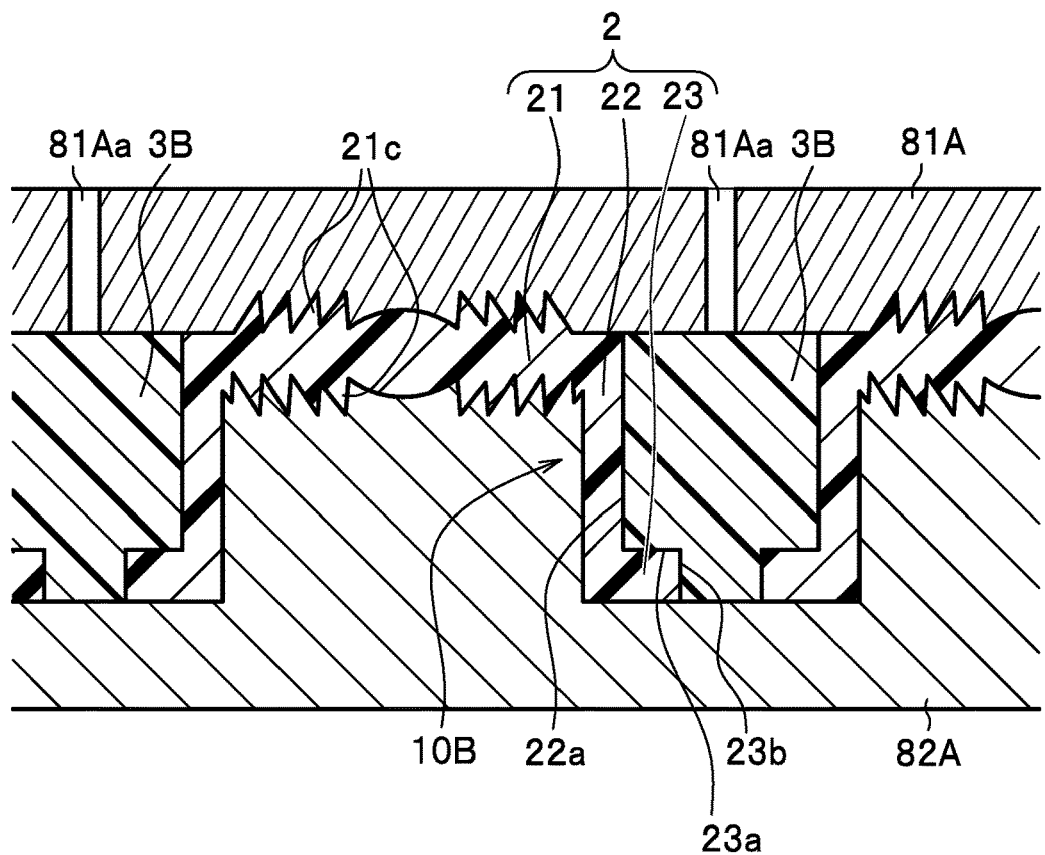
FIG. 11C is a cross-sectional view schematically illustrating arranging a cut cover blank in a second mold and forming a lens blank in a method of manufacturing a lens according to the third embodiment.
Figure 11D:
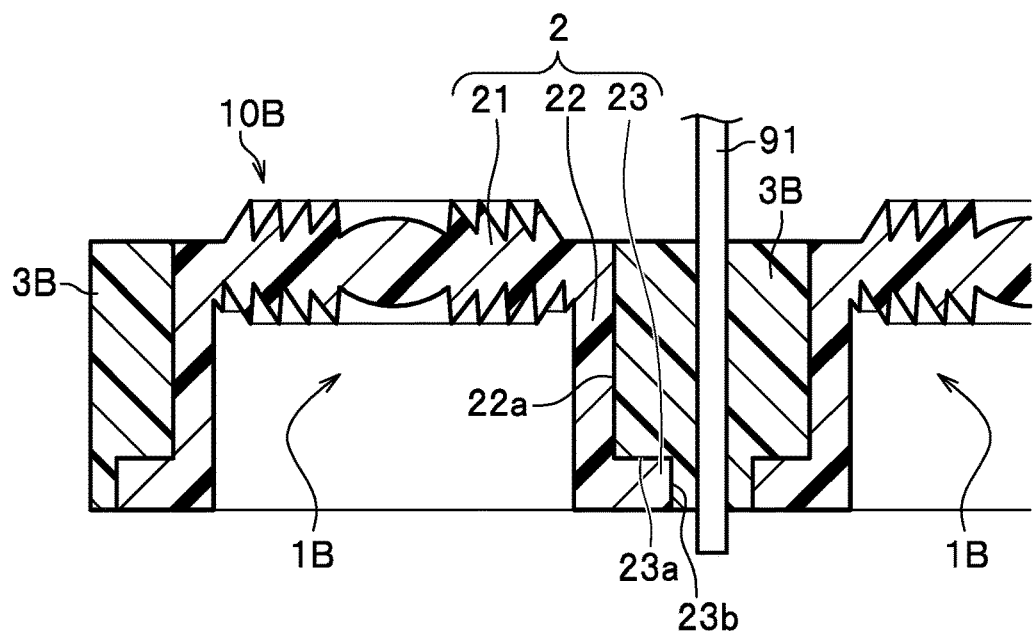
FIG. 11D is a cross-sectional view schematically illustrating cutting a lens blank to singulate lenses in a method of manufacturing a lens according to the third embodiment.

FIG. 10 is a flow chart showing a procedure of a method of manufacturing a lens according to the first embodiment. FIG. 11A is a cross-sectional view schematically illustrating forming a cover blank in a method of manufacturing a lens according to the third embodiment. FIG. 11B is a cross-sectional view schematically illustrating cutting a cover blank in a method of manufacturing a lens according to the third embodiment. FIG. 11C is a cross-sectional view schematically illustrating arranging a cut cover blank in a second mold and forming a lens blank in a method of manufacturing a lens according to the third embodiment. FIG. 11D is a cross-sectional view schematically illustrating cutting a lens blank to obtain individual lenses in a method of manufacturing a lens according to the third embodiment.

The method of manufacturing a lens 1B includes forming (S11) a cover blank, removing (S12) a first mold, cutting (S13) the cover blank, arranging (S14) the cover blank in a second mold, forming (S15) a lens blank, and obtaining (S16) individual lenses, which are performed in this order. With the method of manufacturing described above, a lens 1B yielding a reduction of leaking light can be produced.

The materials and arrangements of the members are similar to those described for the lens 1B and therefore the description thereof will be appropriately omitted.

Forming Cover Blank

As shown in FIG. 11A, in the forming (S11) a cover blank, a thermosetting first resin is injected in a first mold and cured to form a cover blank 20 having a plurality of cover parts 2 each having a lens part 21 having lateral sides, connection part 22 constituting lateral side walls each extending downward from a respective one of the lateral sides of the lens part 21, and a flange part 23 extending outward from a lower-end portion of the lateral side walls constituted by the connection part 22. The lens part 21, the connection part 22, and the flange part 23 are formed continuous with one another.

In the forming (S11) a cover blank, an upper mold 61 and a lower mold 62 adapted for transfer molding are employed as the first mold. The upper mold 81A and the lower mold 82A are closed, and the thermosetting second resin, which is heated and softened, is injected under pressure into the second mold through a resin injecting port 61a provided in the upper mold 61. The thermosetting first resin is cured in the heated mold, such that a cover blank 20 having a plurality of cover parts 2 connected to one another at the flange parts 23 is molded.

In the forming (S11) a cover blank, the upper mold 61 and the lower mold 62 are designed to produce a cover blank 20 having a plurality of cover parts 2 each formed with a recess having an opening facing downward. The recess is defined by the lens part 21 and the connection part 22 with an opening located inward of the flange part 23. Each of the lens parts 21 of the cover blank 20 has a plurality of ridges 21c at both upper and lower sides. Further, in the forming (S11) a cover blank, the upper mold 61 and the lower mold 62 are designed to produce a cover blank 20 having a plurality of cover parts 2 each having the flange part 23 with a thickness greater than 30 µm, which is greater than a thickness of the connection part 22.

Removing First Mold

In the removing (S12) the first mold, the first mold is removed after the cover blank 20 is formed. In this step, all parts (the upper mold 61 and the lower mold 62) of the first mold are removed.

Cutting Cover Blank

As shown in FIG. 11B, in the cutting (S13) the cover blank, the cover blank 20 is cut at the flange part 23 between adjacent cover parts 2 to obtain individual cover blanks 20A. Cutting of the cover blank 20 can be performed by using a cutting tool 91 such as a known blade or the like. It is preferable to adjust the cutting width of the cutting tool 91 such that the flange part 23 of the individual cover blank 20A has a length in a range of 200 µm to 1000 µm.

Arranging Cover Blank in Second Mold

In the arranging (S14) the cover blank in the second mold, cut cover blank 20 (singulated cover blank 20A) is arranged in another set of mold (an upper mold 81A and a lower mold 82A) adapted for transfer molding.

Forming Lens Blank

In the forming (S15) a lens blank, a thermosetting second resin having a greater light-absorptance or a greater light-reflectance than the thermosetting first resin is injected in the second mold and cured, to form a lens blank 10B having a light-shielding part 3 between adjacent cover parts 2. In the forming (S15) a lens blank, the upper mold 81A and the lower mold 82A are closed, and the thermosetting second resin, which is heated and softened, is injected under pressure into the second mold through a resin injecting port 81Aa formed in the upper mold 81A. The thermosetting second resin is cured in the heated mold, such that a lens blank 10B having a light-shielding part 3B between adjacent cover parts 2, in a rectangular shape in a cross-section that is in conformity to the shape of the outer lateral surface 22a of the side walls constituted by the connection part 22 and covering an upper surface 23a and an outer end surface 23b of the flange part 23 is molded.

Obtaining Individual Lenses

As shown in FIG. 11D, in the obtaining (S16) individual lenses, the lens blank 10B is singulated into individual lenses 1B. That is, in the obtaining (S16) individual lenses, all parts of the second mold are removed to take out the lens blank 10B, and the lens blank 10B is cut along a center of the light-shielding part 3B between adjacent cover parts 2. The singulating is performed by cutting at the light-shielding part 3B, thus obtaining individual lenses 1B each having the light-shielding part 3B covering the outer lateral surfaces 22a of the lateral side walls constituted by the connection part 22 and also covering the outer end surfaces 23b of the flange part 23.

In the obtaining (S16) individual lenses, the lens blank 10B is cut along the center of the light-shielding part 3B between the outer lateral surfaces 22a of the lateral side walls constituted by the connection part 22 and between outer end surfaces 23b of adjacent flange parts 23 of the lens blank, to obtain individual lenses 1B each having the light-shielding part 3 covering the outer lateral surfaces 22a of the lateral side walls constituted by the connection part 22, the upper surface 23a of the flange part 23, and the outer end surfaces of the flange part 23. In a cross-section, the light-shielding part 3B of each of the individual lenses 1B has a rectangular shape in conformity to the shapes of the outer lateral surfaces 22a of the lateral side walls constituted by the connection part 22 and covering the outer end surface 23b of the flange part 23. Cutting of the light-shielding part 3B can be performed by using a cutting tool 91 such as a known blade or the like.

Method of Manufacturing Light Emitting Device

Next, a method of manufacturing a light emitting device 100B will be described.

The method of manufacturing the light emitting device 100B includes providing a lens and disposing the lens, which can be performed in this order. The method of manufacturing the light emitting device 100B can be performed in a similar manner as in the method of manufacturing the light emitting device 100 according to the first embodiment, except for using the lens 1B.

Fourth Embodiment, Fifth Embodiment

Figure 12A:
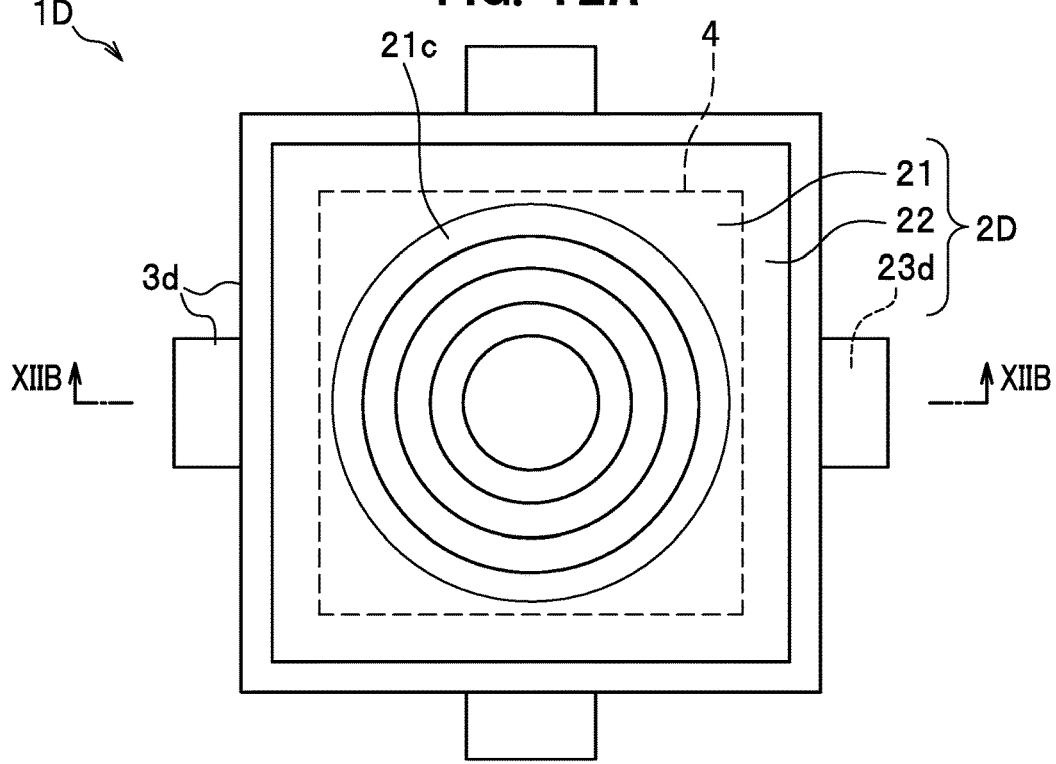
FIG. 12A is a plan view schematically showing a structure of a lens according to a fourth embodiment.
Figure 12B:
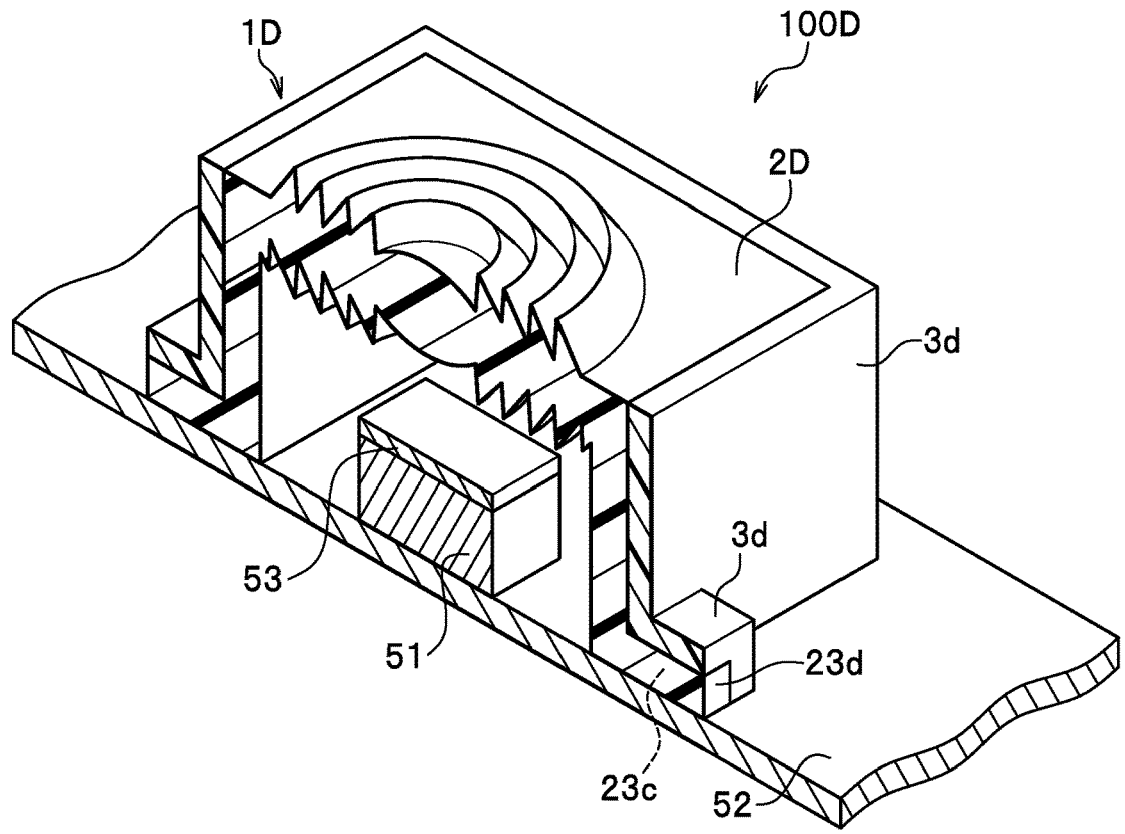
FIG. 12B is a schematic perspective cross-sectional view taken along line XIIB-VIIB of FIG. 12A.
Figure 13A:
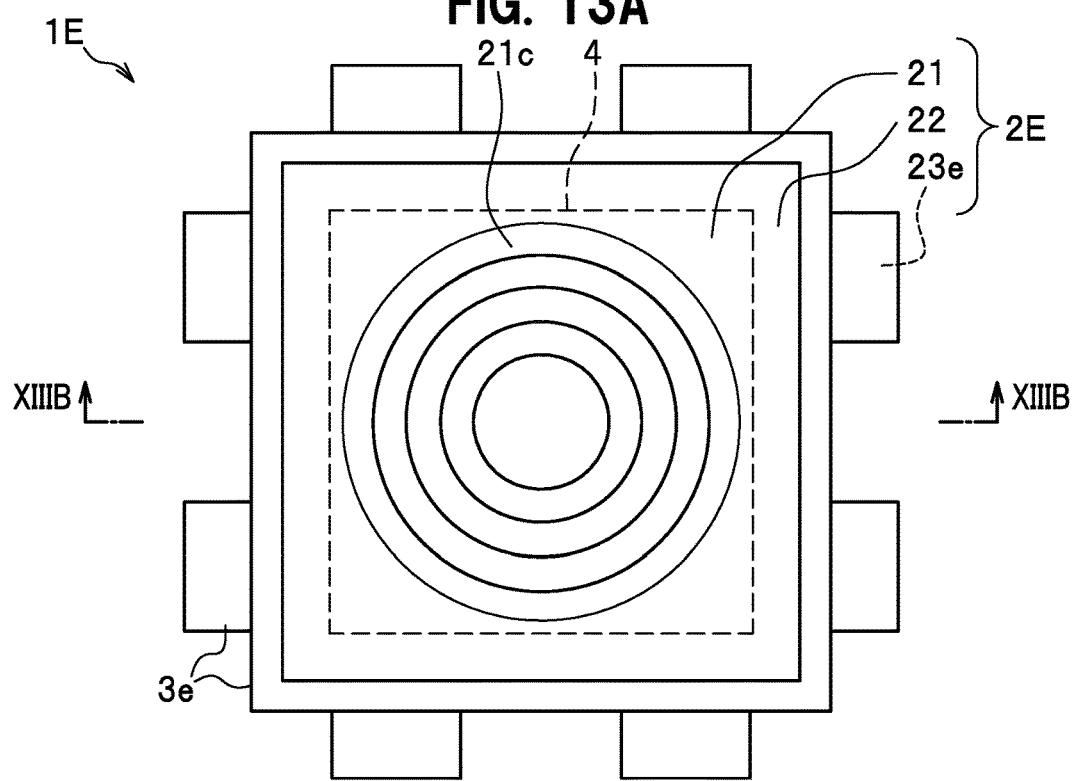
FIG. 13A is a plan view schematically showing a structure of a lens according to a fifth embodiment.
Figure 13B:
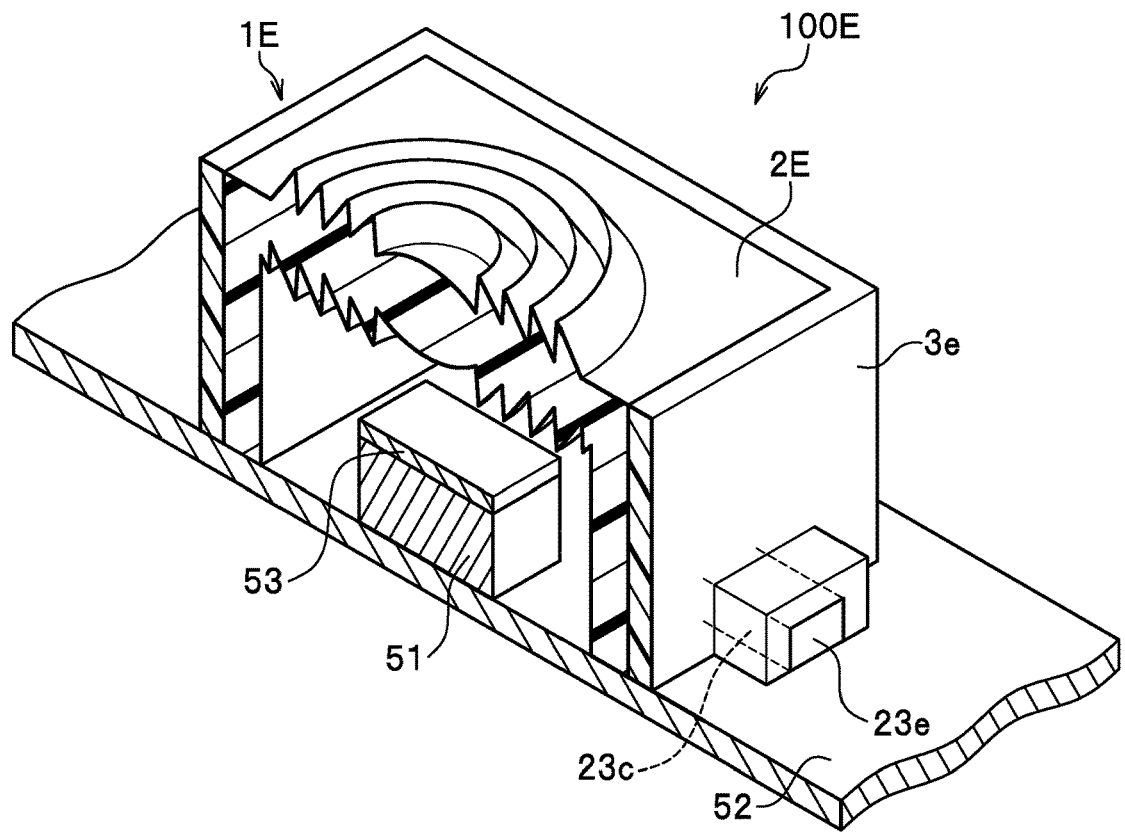
FIG. 13B is a schematic perspective cross-sectional view taken along line XIIIB-VIIIB of FIG. 13A.

In the first embodiment to the third embodiment, structures including the flange part 23 provided along a lower end-portion (e.g., an opening-end portion) of entire outer periphery of the lateral side walls constituted by the connection part 22 have been illustrated, but as shown in FIG. 12A, FIG. 12B, FIG. 13A, and FIG. 13B, one or more flange parts 23d may be formed such that each flange part 23d is formed extending outward from a lower end portion of a corresponding one of the lateral side walls constituted by the connection part 22. FIG. 12A is a plan view schematically showing a structure of a lens according to a fourth embodiment. FIG. 12B is a schematic cross-sectional view taken along line XIIB-VIIB of FIG. 12A. FIG. 13A is a plan view schematically showing a structure of a lens according to a fifth embodiment. FIG. 13B is a schematic cross-sectional view taken along line XIIIB-XIIIB of FIG. 13A.

As shown in FIG. 12A and FIG. 12B, in the lens 1D and the light emitting device 100D according to the fourth embodiment, each flange part 23d is formed extending outward from a lower end portion of a corresponding one of the outer lateral surfaces of the lateral side walls of the connection part 22 along a partial length thereof. With this structure, the volume of the flange part 23d can be reduced. That is, the surface area of the flange part 23d can be reduced. Further, the lens 1D includes a light-shielding part 3d covering an upper surface and lateral end surfaces of each flange part 23d and the lateral outer surfaces of the lateral side walls constituted by the connection part 22. Accordingly, when the lens 1D is in operation, leaking of light through lateral sides of the lens 1D, particularly leaking of light through the flange parts 23d can be further reduced.

The flange parts 23d are formed at locations such that, in a plan view, each two opposite flange parts 23d are substantially symmetric about a plane parallel to their corresponding ones of the lateral side walls constituted by the connection part 22 and is passing through the center of the lens part 21. The flange parts 23d have a thickness greater than that of the connection part 22. The flange parts 23d are arranged one on the lower end portion of each of the outer lateral surfaces of the lateral side walls of the connection part 22, such that four flange parts 23d are arranged on the outer periphery of the connection part 22 each along a partial length thereof. Each of the flange parts 23d is located substantially central to the width of the outer lateral surface of the corresponding one of the side walls constituted by the connecting part 22. The flange parts 23d each preferably have a width in a range of 50 µm to 1,000 µm. The flange parts 23d each have a thickness of preferably 30 µm or greater, more preferably 50 µm, or 100 µm.

With the structure as described above, more stable bonding or fixing to the substrate 52 can be achieved in the lens 1D and the light emitting device 100D according to the fourth embodiment.

As shown in FIG. 13A and FIG. 13B, in a lens 1E and a light emitting device 100E according to a fifth embodiment, two flange parts 23e are formed on a lower end portion of each of the outer lateral surfaces of the lateral side walls constituted by the connection part 22, such that eight flange parts 23e are arranged on the outer periphery of the connection part 22 each along a partial length thereof. The flange parts 23e formed on the outer lateral surface of a single lateral side wall are spaced apart from each other. Each two spaced apart flange parts 23e formed on one outer lateral surface of the connection part 22 and the two spaced apart flange parts 23e formed on the outer lateral surface opposite the one outer lateral surface are respectively located opposite from each other. Other structures are similar to that in the lens 1 and the light emitting device 100 according to the first embodiment.

In the fifth embodiment, two flange parts 23e are disposed on each of the outer lateral surfaces of the lateral side walls constituted by the connection part 22, but three or four flange parts 23e may be formed on each of the outer lateral surfaces of the lateral side walls constituted by the connection part 22. Different pair of opposite outer lateral surfaces of the connection part 22 may be provided with a different number of the flange parts 23e.

Sixth Embodiment

Figure 14:
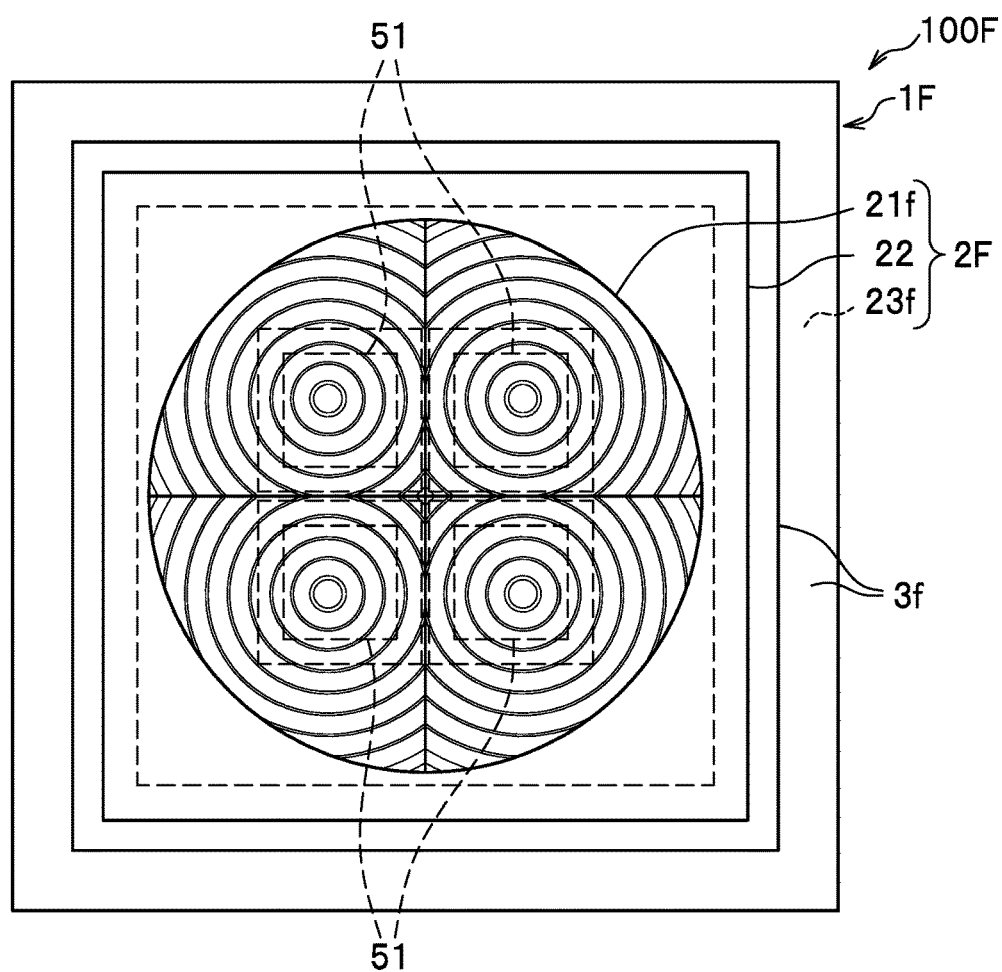
FIG. 14 is a plan view schematically showing a structure of a lens according to a sixth embodiment.

For example, as the lens 1F and the light emitting device 100F shown in FIG. 14, a lens part 21f may be a compound eye lens having a plurality of Fresnel lenses. FIG. 14 is a plan view schematically showing a structure of a lens 1F according to a sixth embodiment. The lens 1F has a lens part 21f including a circular lens functioning part at a center of a rectangular shape in a plan view, and a flat plate-like shape around surrounding the lens functioning parts. The circular lens part in the lens part 21f is cut in four, and a respective one of a quarter of the circular part is formed into a Fresnel lens. It is preferable that light emitting elements 51 of a number corresponding to the number of the Fresnel lens are disposed such that a center of each of the light emitting elements 51 is offset toward the center of the lens part 21f from the center of corresponding Fresnel lens of the lens part 21f. When the lens part 21f has a compound eye lens, disposing the light emitting elements 51 with the centers offset from the centers of the respective Fresnel lenses as described above allows for an increase of the light extraction efficiency. It is further preferable that two types of the light emitting elements 51 to emit two different emission colors are employed and the light emitting elements 51 of the same emission color are disposed diagonally. The lens 1F has a structure similar to that shown in FIG. 1, except that the flange part 23f has a thickness greater than that of the connection part 22. The flange part 23f may be provided partially along the outer lateral surfaces of the side walls constituted by the connection part 22 as in the other embodiments.

Seventh Embodiment

Figure 15:
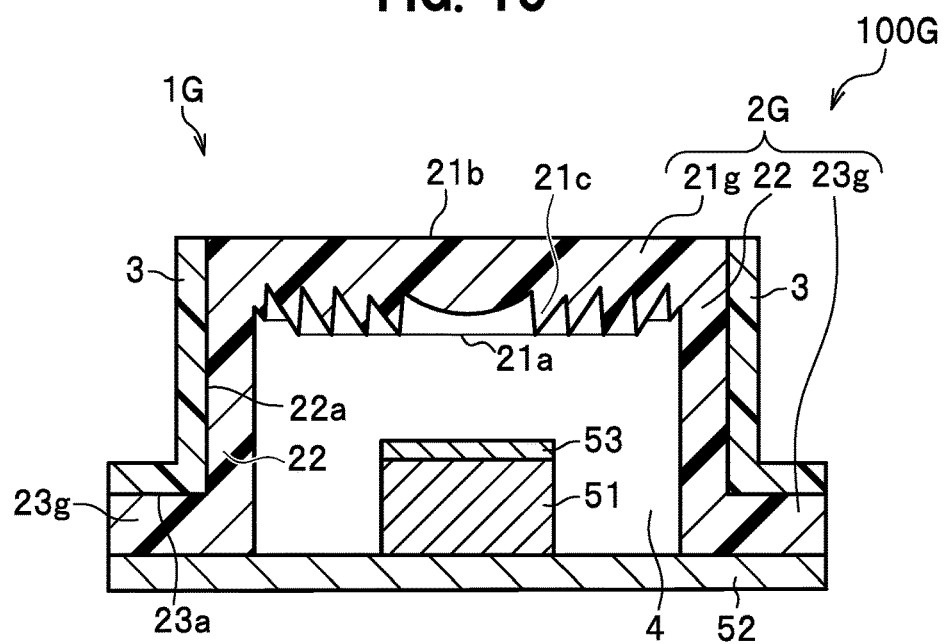
FIG. 15 is a cross-sectional view schematically showing a structure of a light emitting device according to a seventh embodiment, taken along a line passing through the center of the light emitting device.

As shown in FIG. 15, a plano-convex Fresnel lens having a plurality of ridges 21c on either upward-facing surface or downward-facing surface (in FIG. 15, the light-incident surface 21a) may be used in the lens part 21g of the lens 1G and the light emitting device 100G. FIG. 15 is a cross-sectional view schematically showing a structure of the light emitting device according to a seventh embodiment. When a compound eye lens is employed, a structure having the plurality of projections 21c either in the upward-facing surface or the downward-facing surface of the lens part 21g can also be employed. That is, it is preferable that the lens part 21g has a light incident surface 21a with a plurality of ridges 21c, and a flat or substantially flat light-emitting surface 21b such that the light-emitting surface 21b of the lens part 21g can be arranged in parallel to the light emitting surface of the light emitting element 51. The light-emitting surface 21b may have microscopic projections formed by emboss processing, mat processing, or the like, which are lower than the ridges 21c. With this, light emitted through the light-emitting surface 21b can be uniformly dispersed. As in the lens 1G and the light emitting device 100G, employing a structure having a plurality of ridges 21c only on the light-incident surface 21a, allows for a reduction in a dimension in height direction, because the upward-facing surface does not have the ridges 21c.

Eighth Embodiment

Figure 16:
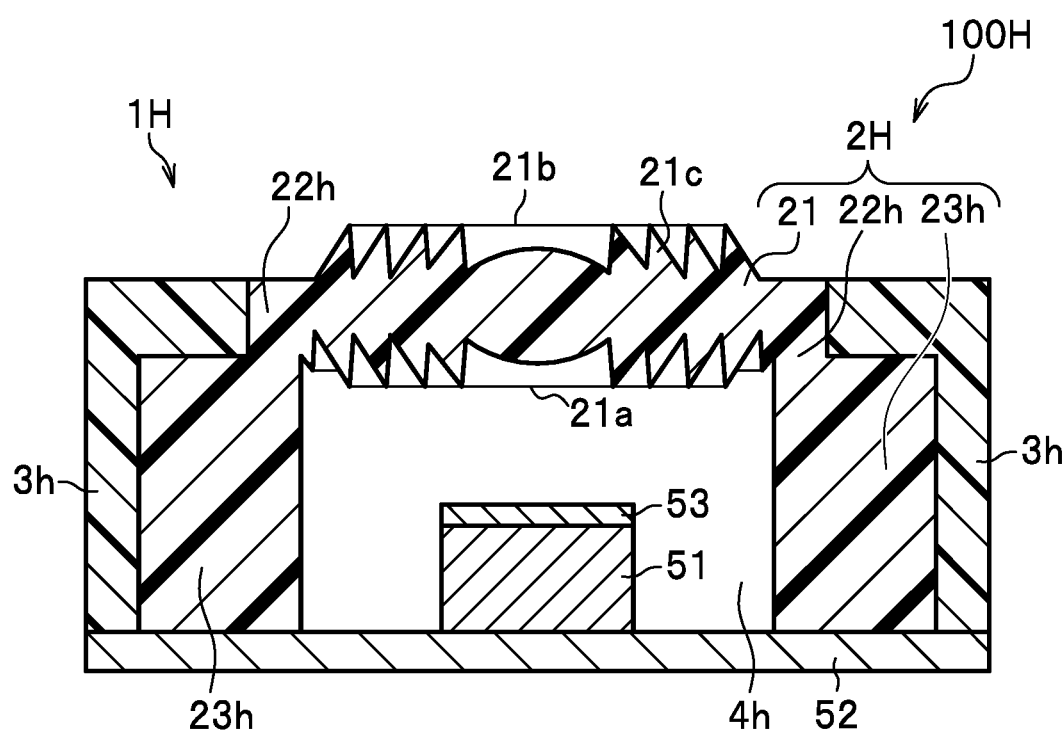
FIG. 16 is a cross-sectional view schematically showing a structure of a light emitting device according to an eighth embodiment.

As shown in FIG. 16, a lens 1H and a light emitting device 100H may have a structure in which a connection part 22h is located only along on a lateral side of the lens part 21 and a flange part 23h is formed extending downward from the connection part 22 with a thickness greater than the thickness of the connection part 22h. FIG. 16 is a cross-sectional view schematically showing a structure of the light emitting device according to an eighth embodiment.

In the lens 1H, outer lateral surfaces of the connection part 22 and upper surfaces and outer lateral sides of the flange part 23h are covered by a light-shielding part 3h. In the lens 1H, the flange part 23h and the lens part 21h define a recess 4h. In the lens 1H, the lower surface of the flange part 23 and the lower surface of the light-shielding part 3h are bonded to the substrate 52 through an adhesive such that the lens part 21h faces the light emitting element 51 mounted on the substrate 52. In the lens 1H, the flange part 23h has a thickness greater than that of the connection part 22h, for example, the flange part 23h has a thickness in a range of 30 μm to 1,000 μm.

In the light emitting device 100H, the light emitting element 51 mounted on the substrate 52 is spaced apart from the lens part 21h of the lens 1H depending on the height of the flange part 23h of the lens 1H.

Variant Example

Figure 17A:
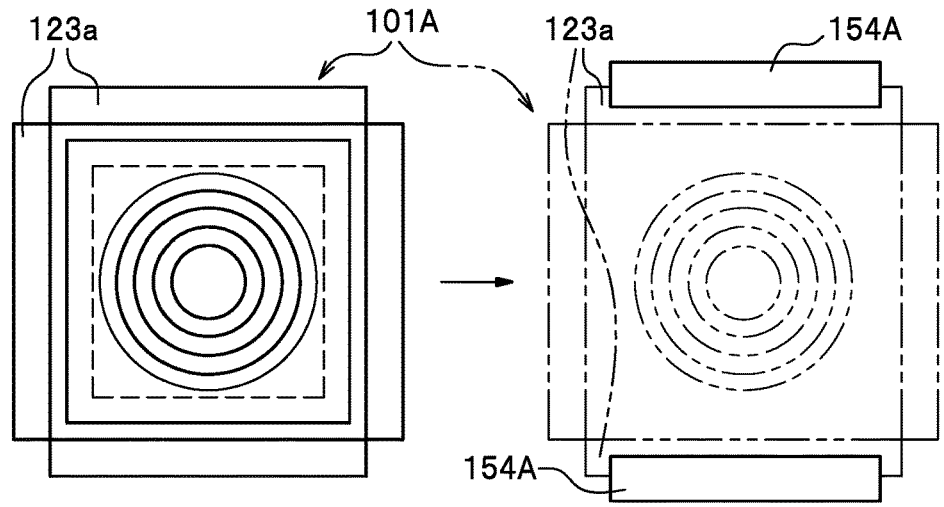
FIG. 17A is a schematic plan diagram showing a variational example of a flange part of a lens and illustrating an engaged state of the flange part with an engaging part.
Figure 17B:
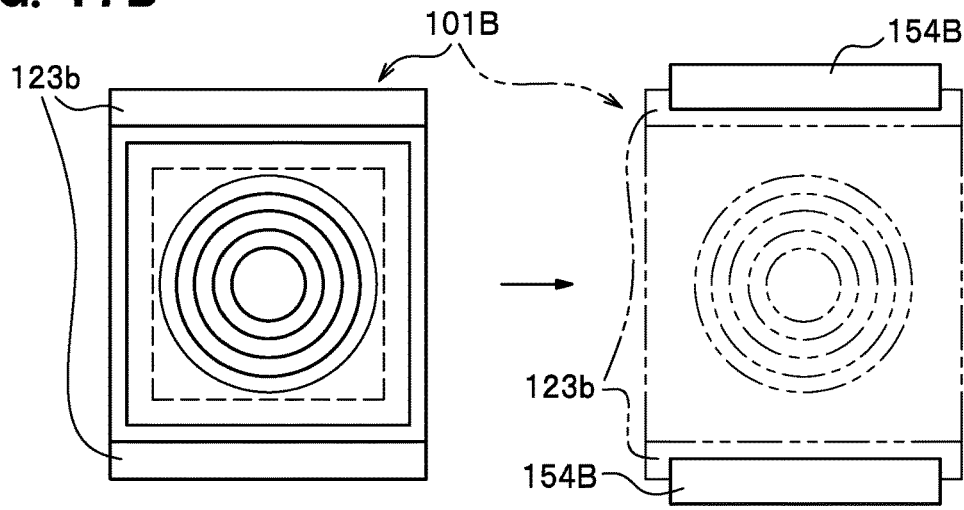
FIG. 17B is a schematic plan diagram showing another variational example of a flange part of a lens and illustrating an engaged state of the flange part with an engaging part.
Figure 17C:
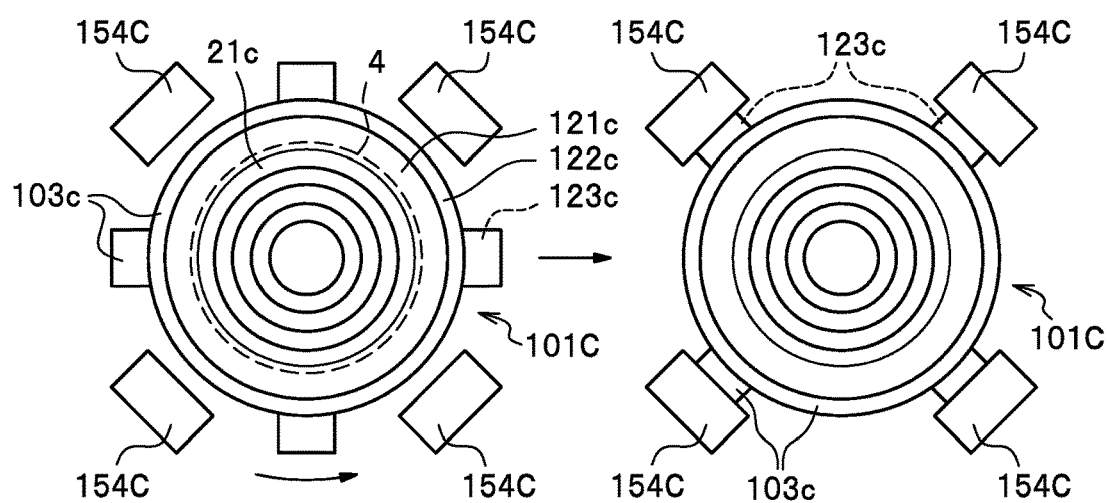
FIG. 17C is a schematic plan diagram showing a variational example of a lens and illustrating an engaged state of the lens with an engaging part.

As shown in FIG. 17A and FIG. 17B, the lens and the light emitting device may include the flange part at different position(s) or in different numbers and/or shape(s) than those described above. Alternatively, as shown in FIG. 17C, the lens part and the connection part may have a shape other than a quadrangular shape in a plan view. FIG. 17A is a schematic plan diagram illustrating a variant example of a flange part of a lens and illustrating an engaged state of the flange part with an engaging part. FIG. 17B is a schematic plan diagram illustrating another variant example of a flange part of a lens and illustrating an engaged state of the flange part with an engaging part. FIG. 17C is a schematic plan diagram illustrating a variant example of a lens and illustrating an engaged state of the lens with an engaging part.

As shown in FIG. 17A, the lens 101A may have four flange parts 123a on four sides of the connection part respectively, with a width equivalent to the width of the connection part. Alternatively, as shown in FIG. 17B, the lens 101A may have two flange parts 123b on opposite two sides of the connection part respectively, with a width smaller than the width of the connection part. The flange parts 123a and the flange parts 123b may be respectively configured for slide engagement with engaging parts 154A and engaging parts 154B provided on the substrate, in the respective light emitting devices.

As shown in FIG. 17C, the lens 101C can be formed with the lens part 121c in a circular shape in a plan view, the connection part 122c in a cylindrical shape, and four flange parts 123c provided every 90 degrees with respect to the outer periphery of the connection part 122c in a plan view, such that respective two flange parts 123c are opposite to each other. The outer lateral sides of the connection part 122c and the upper surface and lateral end surfaces of each of the flange parts 123c are covered by the light-shielding part 103c. As illustrated above, the lens part 121c can be formed in a shape other than a quadrangular shape and the connection part 122c can be disposed in conformity with the shape of the lens part 121c, at the outer edge of the lens part 121c and downward. The light emitting device can be assembled by rotatively sliding the lens 101C such that the flange parts 123c are engaged with respective engaging parts 154C provided on the substrate. In the variant example illustrated in FIG. 17C, the lens part 121c has a circular shape, but the lens part 121c can be in a triangular shape or a pentagonal or higher polygonal shape. In each variational example, the location of the light-shielding part may be, as has been described above. The lens and light emitting device of each variational example can be manufactured according to the methods described above, with appropriately changing respective molds.

The lens and light emitting device, and the method of manufacturing the lens and the method of manufacturing the light emitting device described above are not limited to those embodiments described above.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A lens comprising a cover part and a light-shielding part, wherein
   the cover part comprises:
      a lens part having one or more lateral sides;
      a connection part constituting one or more lateral side walls each extending downward from a respective one of the one or more lateral sides of the lens part; and one or more flange parts each extending outward from a lower-end portion of a corresponding one of the one or more lateral side walls,
the lens part and the connection part define a recess having an opening facing downward,
the lens part defines a bottom surface of the recess,
the one or more lateral side walls extend from the bottom surface of the recess and define lateral surfaces of the recess, which define the opening of the recess,
the one or more flange parts extend outward from a periphery of the opening of the recess,
the lens part, the one or more flange parts, and the connection part are formed of a thermosetting first resin and continuous to one another;
the light-shielding part covers an entirety of outer lateral surfaces of the one or more lateral side walls and an entirety of upper surfaces of the one or more flange parts and is formed of a thermosetting second resin having a greater light-absorptance or a greater light-reflectance than the thermosetting first resin; and
the flange part has a greater thickness than the connection part.

2. The lens according to claim 1, wherein at least either the thermosetting first resin or the thermosetting second resin is silicone resin.

3. The lens according to claim 1, wherein the lens part is a Fresnel lens.

4. The lens according to claim 3, wherein the Fresnel lens is a compound eye Fresnel lens having a plurality of lens centers.

5. The lens according to claim 1, wherein the one or more flange parts have a length in a range of 200 µm to 3,000 µm.

6. The lens according to claim 1, wherein the light-shielding part has a thickness in a range of 200 µm to 3,000 µm.

7. The lens according to claim 1, wherein the one or more flange parts comprise a single flange part entirely surrounding the one or more lateral side walls.

8. The lens according to claim 1, wherein the one or more flange parts comprise a plurality of flange parts, and the plurality of flange parts are each formed extending from a lower-end portion of a corresponding one of the one or more lateral side walls in a manner partially surrounding the corresponding one of the one or more lateral side walls.

9. The lens according to claim 8, wherein the plurality of flange parts each have a width in a range of 50 µm to 1,000 µm.

10. The lens according to claim 8, wherein two of the plurality of flange parts are located opposite to each other.

11. The lens according to claim 1,
wherein the light-shielding part is disposed on the entirety of the outer lateral surfaces of the one or more lateral side walls and the entirety of the upper surfaces of the one or more flange parts without using an adhesive material.

12. A lens comprising a cover part and a light-shielding part, wherein
the cover part comprises:
a lens part having one or more lateral sides;
a connection part constituting one or more lateral side walls each extending downward from a respective one of the one or more lateral sides of the lens part; and
one or more flange parts each extending outward from a lower-end portion of a corresponding one of the one or more lateral side walls,
the lens part and the connection part define a recess having an opening facing downward,
the lens part defines a bottom surface of the recess,
the one or more lateral side walls extend from the bottom surface of the recess and define lateral surfaces of the recess, which define the opening of the recess,
the lens part, the one or more flange parts, and the connection part are formed of a thermosetting first resin and are continuous to one another,
the one or more flange parts each have a thickness greater than 30 µm, and
the light-shielding part covers an entirety of outer lateral surfaces of the one or more lateral side walls and an entirety of upper surfaces of the one or more flange parts and is formed of a thermosetting second resin having a greater light-absorptance or a greater light-reflectance than the thermosetting first resin.

13. The lens according to claim 12, wherein the recess is located inward of the one or more flange part.

14. The lens according to claim 12,
wherein the light-shielding part is disposed on the entirety of the outer lateral surfaces of the one or more lateral side walls and the entirety of the upper surfaces of the one or more flange parts without using an adhesive material.

15. A light emitting device comprising:
a light emitting element; and
a lens comprising a cover part and a light-shielding part, wherein
the cover part comprises:
a lens part having one or more lateral sides;
a connection part constituting one or more lateral side walls each extending downward from a respective one of the one or more lateral sides of the lens part; and
one or more flange parts each extending outward from a lower-end portion of a corresponding one of the one or more lateral side walls;
the lens part and the connection part define a recess having an opening facing downward,
the lens part defines a bottom surface of the recess,
the one or more lateral side walls extend from the bottom surface of the recess and define lateral surfaces of the recess, which define the opening of the recess,
the one or more flange parts extend outward from a periphery of the opening of the recess,
the lens part, the one or more flange parts, and the connection part are formed of a thermosetting first resin and are continuous to one another,
the light-shielding part covers an entirety of outer lateral surfaces of the one or more lateral side walls and an entirety of upper surfaces of the one or more flange parts and is formed of a thermosetting second resin having a greater light-absorptance or a greater light-reflectance than the thermosetting first resin,
the one or more flange parts have a greater thickness than the connection part, and
the lens part is disposed at a location allowing light from the light emitting element to be transmitted through the lens part.

16. The light emitting device according to claim 15, further comprising a substrate having the light emitting element mounted thereon, wherein the lens is disposed on the substrate with the one or more flange parts connected to the substrate such that the lens part faces the light emitting element.

17. The light emitting device according to claim 15, wherein the light emitting element is spaced apart from the lens part and the connection part.

18. The light emitting device according to claim 17, wherein the connection part is formed such that a distance between the lens part and the light emitting element is smaller than a distance between the connection part and the light emitting element.

19. The light emitting device according to claim 15,
wherein the light-shielding part is disposed on the entirety of the outer lateral surfaces of the one or more lateral side walls and the entirety of the upper surfaces of the one or more flange parts without using an adhesive material.

20. A light emitting device comprising:
a light emitting element; and
a lens comprising a cover part and a light-shielding part, wherein
the cover part comprises:
  a lens part having one or more lateral sides;
  a connection part constituting one or more lateral side walls each extending from a respective one of the one or more lateral sides of the lens part; and
  one or more flange parts each extending outward from a lower-end portion of a corresponding one of the one or more lateral side walls,
the lens part and the connection part define a recess having an opening facing downward,
the lens part defines a bottom surface of the recess,
the one or more lateral side walls extend from the bottom surface of the recess and define lateral surfaces of the recess, which define the opening of the recess,
the lens part, the one or more flange parts, and the connection part are formed of a thermosetting first resin and are continuous to one another, with a thickness of each of the one or more flange parts being greater than 30 μm,
the light-shielding part covers an entirety of outer lateral surfaces of the one or more lateral side walls and an entirety of upper surfaces of the one or more flange parts and is formed of a thermosetting second resin having a greater light-absorptance or a greater light-reflectance than the thermosetting first resin, and
the lens part is disposed at a location allowing light from the light emitting element to be transmitted through the lens part.

21. The light emitting device according to claim 20,
wherein the light-shielding part is disposed on the entirety of the outer lateral surfaces of the one or more lateral side walls and the entirety of the upper surfaces of the one or more flange parts without using an adhesive material.

\* \* \* \* \*